US007622808B2

United States Patent
Ohtake et al.

(10) Patent No.: US 7,622,808 B2
(45) Date of Patent: Nov. 24, 2009

(54) SEMICONDUCTOR DEVICE AND HAVING TRENCH INTERCONNECTION

(75) Inventors: Hiroto Ohtake, Tokyo (JP); Masayoshi Tagami, Tokyo (JP); Munehiro Tada, Tokyo (JP); Yoshihiro Hayashi, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 11/317,399

(22) Filed: Dec. 23, 2005

(65) Prior Publication Data

US 2006/0131754 A1 Jun. 22, 2006

Related U.S. Application Data

(63) Continuation-in-part of application No. PCT/JP2004/010183, filed on Jul. 16, 2004.

(30) Foreign Application Priority Data

Jul. 18, 2003 (JP) ............... 2003-277086

(51) Int. Cl.
*H01L 23/48* (2006.01)

(52) U.S. Cl. ............ 257/760; 257/758; 257/759; 257/E21.575; 257/E21.641; 257/E21.627; 257/E21.597

(58) Field of Classification Search ............ 257/758, 257/759, 760, 774, 762, E21.575, E21.641, 257/E21.627, E21.597
See application file for complete search history.

(56) References Cited

U.S. PATENT DOCUMENTS

| 5,821,168 | A | * | 10/1998 | Jain | ............... | 438/692 |
| 5,889,302 | A | * | 3/1999 | Liu | ............... | 257/315 |
| 6,407,011 | B1 | * | 6/2002 | Ikeda et al. | ............... | 438/786 |
| 6,815,824 | B2 | * | 11/2004 | Shioya et al. | ............... | 257/760 |
| 2003/0134505 | A1 | | 7/2003 | Dalton et al. | | |

(Continued)

FOREIGN PATENT DOCUMENTS

JP P2000-277515 10/2000

(Continued)

OTHER PUBLICATIONS

T.I. Bao, et al, "90nm Generation Cu/CVD Low-k (k<2.5) Interconnect Technology", IEEE International Electron Device Meeting (IEDM) 2002, pp. 583.

(Continued)

*Primary Examiner*—Wael Fahmy
*Assistant Examiner*—Marc Armand
(74) *Attorney, Agent, or Firm*—Scully, Scott, Murphy & Presser, P.C.

(57) ABSTRACT

A semiconductor device includes a first interconnection layer and a interlayer insulating layer. The first interconnection layer is formed on a upper side of a substrate, and includes a first interconnection. The interlayer insulating layer is formed on the first interconnection layer, and includes a via connected with the first interconnection at one end of the via and a second interconnection connected with the via at another end of the via. The interlayer insulating layer has a relative dielectric constant lower than that of a silicon oxide film. An upper portion of the interlayer insulating layer includes a silicon-oxide film, a silicon nitride film and a silicon oxide film in order from a lower portion.

5 Claims, 18 Drawing Sheets

U.S. PATENT DOCUMENTS

| | | | |
|---|---|---|---|
| 2004/0048468 A1* | 3/2004 | Liu et al. | 438/687 |
| 2004/0106266 A1* | 6/2004 | Huang et al. | 438/393 |

FOREIGN PATENT DOCUMENTS

| | | |
|---|---|---|
| JP | P2001-351976 | 12/2001 |
| JP | P2002-43419 A | 2/2002 |
| JP | P2002-64139 A | 2/2002 |
| JP | P2003-45964 A | 2/2003 |
| JP | P2003-86679 | 3/2003 |
| JP | P2003-133411 A | 5/2003 |
| JP | P2003-163265 A | 6/2003 |
| JP | P2003-520448 | 7/2003 |
| WO | WO 01/80309 A2 | 10/2001 |

OTHER PUBLICATIONS

R. Kanamura, et al., "Integration of Cu/low-k Dual-Damascene Interconnects with a Porous PAE/SiOC Hybrid Structure for 65nm-node High Performance eDRAM", 2003 Symposium on VLSI Technology, pp. 107.

* cited by examiner

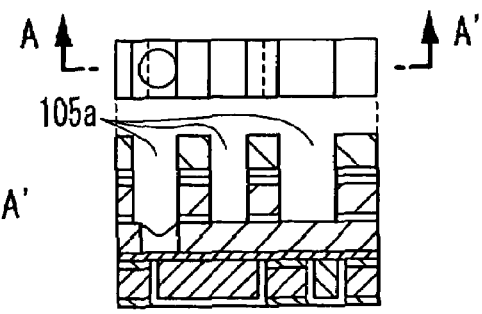
Fig. 1E PRIOR ART A-A'
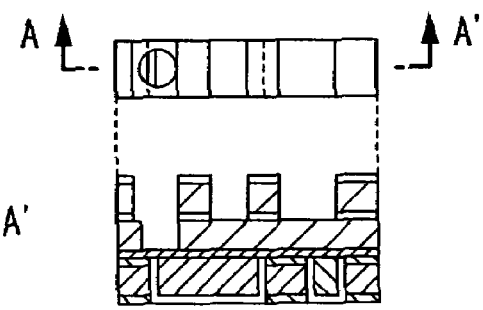
Fig. 1F PRIOR ART A-A'
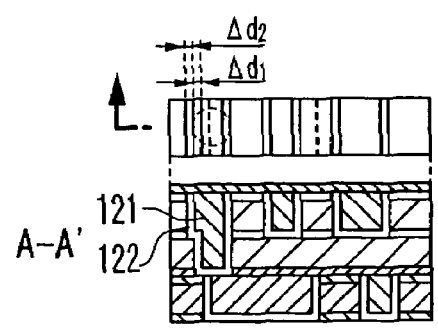
Fig. 1G PRIOR ART A-A'

Fig. 3E PRIOR ART  A-A'
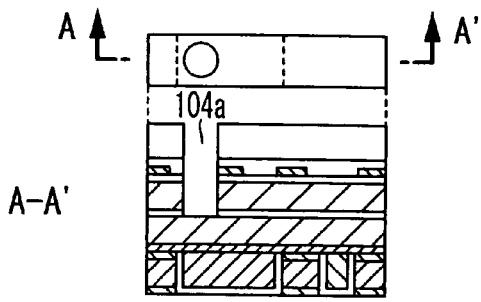
Fig. 3F PRIOR ART  A-A'
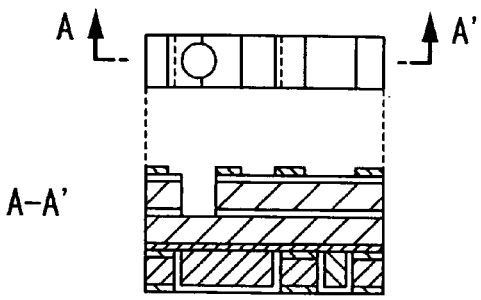
Fig. 3G PRIOR ART  A-A'
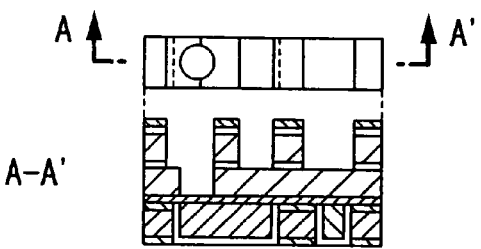
Fig. 3H PRIOR ART  A-A'
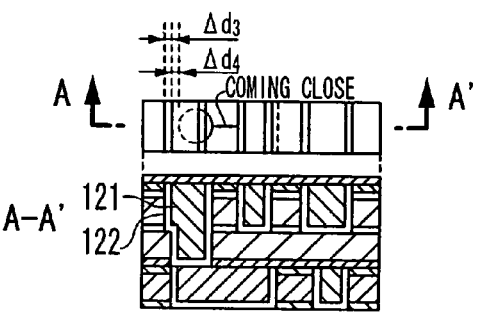
Fig. 3I PRIOR ART  A-A'
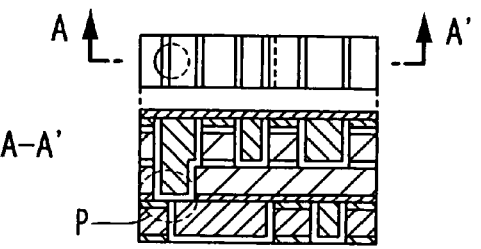

SEMICONDUCTOR DEVICE AND HAVING TRENCH INTERCONNECTION

CROSS REFERENCE TO RELATED APPLICATION

The present application is a continuation-in-part application of PCT/JP2004/010183 filed on Jul. 16, 2004 and claims the benefit of Japanese patent Application 2003-277086 dated Jul. 18, 2003.

BACKGROUND OF THE INVENTION

1. Field of the Invention

The present invention relates to a semiconductor device having a trench interconnection, and a method of manufacturing the semiconductor device.

2. Description of the Related Art

It is essential in recent VLSI devices, to miniaturize and multilayer elements, since millions of elements need to be integrated on a chip with a few square millimeters. In particular, it is important to reduce interconnection resistance and interlayer capacitance, in order to increase a device operating speed.

To reduce the interconnection resistance and the interlayer capacitance, a method is employed that uses copper as an interconnection material and a film having a dielectric constant lower than that of a silicon oxide film as an interlayer dielectric film. Further, a dual-damascene method is used to reduce the number of processes and to improve reliability of a copper interconnection. In the dual-damascene method, since a copper embedding process and a copper CMP process can be cut compared with a single-damascene method, the processes can be greatly reduced. Further, in the dual-damascene method, copper is embedded in an interconnection trench and a via hole at one time. Therefore, breaking of the copper interconnection due to electromigration is not caused, and the reliability of the copper interconnection is improved. There are two conventional techniques for the dual-damascene method.

The first conventional technique is a method of forming a dual-damascene interconnection configuration, generally referred to as a via first method. The technique is disclosed in, for example, T. I. Bao, et al., "90 nm Generation Cu/CVD Low-k (k<2.5) Interconnect Technology", IEEE International Electron Device Meeting (IEDM) 2002, pp 583.

FIGS. 1A to 1G are views showing a method (via first method) of manufacturing a dual-damascene interconnection configuration of the first conventional technique. In each of Figures, the upper part is a top view, and the lower part is an AA cross-sectional view of the top view.

First, as shown in FIG. 1A, a cap film 102 is formed on an upper surface of a lower interconnection layer 101. The cap film 102 is an etching stopper in etching a via interlayer film 103. The via interlayer film 103 is formed on an upper surface of the cap film 102. A stopper film 104 is formed on an upper surface of the via interlayer film 103. The stopper film 104 is an etching stopper in etching a trench interlayer film 105. The trench interlayer film 105 is formed on an upper surface of the stopper film 104. A hard mask 106 is formed on an upper surface of the trench interlayer film 105. An antireflection film 108 and a photoresist 109 are formed on an upper surface of the hard mask 106. A resist pattern 109a for a via-hole opening is formed to the photoresist 109 by using a photolithography technique. Here, a case is shown where the resist pattern 109a is out of alignment by $\Delta d_1$ from a lower interconnection of the lower interconnection layer 101.

Next, as shown in FIG. 1B, the antireflection film 108, the hard mask 106, the trench interlayer film 105, the stopper film 104, and the via interlayer film 103 are etched in order, by using the photoresist 109 on which the resist pattern 109a is formed, as a mask. As a result, a via-hole pattern 103a is formed. At this time, etching of the via interlayer film 103 stops at the cap film 102.

Subsequently, as shown in FIG. 1C, the resist 109 and the antireflection film 108 are removed. After that, as shown in FIG. 1D, an antireflection film 110 and a photoresist 111 are formed on the upper surface of the hard mask 106. The antireflection film 110 protects the cap film 102 under the via-hole pattern 103a. Further, a resist pattern 111a for the interconnection trench is formed to the photoresist 111 by using the photolithography technique. At this time, the resist pattern 111a is exposed in alignment with the via-hole pattern 103a. Here, a case is shown where the resist pattern 111a is out of alignment by $\Delta d_2$ from the via-hole pattern 103a in the photolithography process.

Next, as shown in FIG. 1E, the antireflection film 110, the hard mask 106, and the trench interlayer film 105, which are under the trench of the resist pattern 111a, are etched in order. As a result, an interconnection trench pattern 105a is formed. The cap film 102 under the via-hole pattern 103a is protected from an etching plasma, by an antireflection film under the via-hole pattern 103a. Next, as shown in FIG. 1F, a dual-damascene configuration is formed by removing the cap film 102 after removing the resist 111 and the antireflection film 110.

Next, as shown in FIG. 1G, a barrier film and copper are embedded in the via-hole pattern 103a and the interconnection trench pattern 105a, and a copper interconnection 112 is formed. In this via first method, as shown in the upper part of FIG. 1G, an increase in via resistance corresponds to $\Delta d_1$ only, even if a via pattern for the lower interconnection is out of alignment by $\Delta d_1$. In addition, even if an upper interconnection for the via pattern is out of alignment by $\Delta d_2$, a space between interconnections are narrowed corresponding to $\Delta d_2$ only, a short circuit then being less likely to happen.

That is, the via first process has a characteristic that a margin can be secured for a misalignment between the via hole (via-hole pattern 103a) and the interconnection trench (interconnection trench pattern 105a), since the via pattern (via-hole pattern 103a) is formed earlier.

In the conventional technique of this via first process, an etching residue may be generated in the vicinity of the via-hole opening. FIG. 2 is a cross-sectional view showing the generation of the etching residue in the conventional technique of the via first process. The residue is mainly an etching product which is adhered to the sidewall of the resist or antireflection film embedded in the via during the trench etching. The etching residue causes the breaking of interconnections and a reduction in the reliability, needing to be restrained. The etching residue is especially likely to be generated when the upper interconnection has a wide width.

Further, in the via first process, there are two times of ashing in the situation that the interlayer films (the via interlayer film 103 and the trench interlayer film 105) are bared (FIGS. 1C and 1F). As a result, when a low dielectric constant film and so on, which is weak for an ashing plasma, is used as the interconnection interlayer film (the trench interlayer film 105), damage caused is significant.

Also, it is extremely difficult in the via first process, to remove the resist and again perform trench exposure after trench formation, due to such causes as poor exposure and misalignment. If the ashing is performed after the trench exposure under the condition that the damage due to nitrogen and hydrogen plasmas and so on is not given to the interlayer film, the hard mask 106 is etched at the edges thereof being rounded. As a result, the interlayer film may be bared.

In addition, there is a problem of via poisoning in the via first process. Since a gas is emitted from the resist embedded in the via hole, a situation may occurs, in which a periphery of the via is not well exposed. Due to this via poisoning, it is possible that a portion where the interconnection trench pattern is supposed to be formed, to be connected to the via hole, is not etched, causing a risk of generating a non-connection portion between the via and the interconnection.

As a second conventional technique, there is a dual hard mask method in which an inorganic film to be a cap of a low dielectric constant film is made into two layers. The technique is disclosed in, for example, R. Kanamura, et al., "Integration of Cu/low-k Dual-Damascene Interconnects with a Porous PAE/SiOC Hybrid Structure for 65 nm-node High Performance eDRAM", 2003 Symposium on VLSI Technology, pp 107.

FIGS. 3A to 3I show a manufacturing method (dual hard mask method) of a dual-damascene interconnection configuration of the second conventional technique. In each of Figures, the upper part is a top view, and the lower part is an AA cross-sectional view of the top view.

First, as shown in FIG. 3A, a cap film 102, a via interlayer film 103, a stopper film 104 and a trench interlayer film 105 are formed on the upper surface of a lower interconnection layer 101, as in the case of FIG. 1A. After that, a lower hard mask 106, an upper hard mask 107, an antireflection film 108 and a photoresist 109 for an interconnection trench are formed on the upper surface of the trench interlayer film 105. A resist pattern 109a for a via-hole opening is formed to the photoresist 109 by using the photolithography technique. Here, a case is shown where the resist pattern 109a is out of alignment by $\Delta d_3$ from a lower interconnection of the lower interconnection layer 101 in the photolithography process.

Next, as shown in FIG. 3B, the antireflection film 108 and the upper hard mask 107 are etched by using the resist pattern 109a as a mask, and the lower hard mask 106 as a stopper. As shown in FIG. 3C, resist removal is performed by using an oxygen plasma. An interconnection trench pattern 107a is formed to the upper hard mask 107 by such a process. That is, the dual hard mask method is one kind of a trench first process. After that, as shown in FIG. 3D, an antireflection film 110 is formed on the upper hard mask 107. A photoresist 111 for the via is formed thereon. A via-hole pattern 111a is formed to the photoresist 111. Here, a case is shown where the via-hole pattern 111a is out of alignment by $\Delta d_4$ from the lower interconnection of the lower interconnection layer 101 in the photolithography process.

Subsequently, as shown in FIG. 3E, the antireflection film 110, the upper hard mask 107, the lower hard mask 106, the trench interlayer film 105, and the stopper film 104 are etched to form a half via-hole pattern 104a by using the photoresist 111 as a mask. After that, as shown in FIG. 3F, the photoresist 111 and the antireflection film 110 on the lower hard mask 106 and the upper hard mask 107 are removed.

Next, as shown in FIG. 3G, the lower hard mask 106 and the trench interlayer film 105 are etched by using the upper hard mask 107 as a mask. At this time, the via interlayer film 103 is etched at the same time in the half via-hole pattern 104a as well by using the stopper film 104 as a mask. By removing the cap film 102 and the stopper film 104, the dual-damascene configuration is formed. Finally, as shown in FIG. 3H, a copper interconnection is formed by embedding a barrier metal and copper in the half via-hole pattern 104a and the interconnection trench pattern 107a.

In the dual hard mask method, the resist and the antireflection film are not embedded in the via hole, since a trench pattern is printed on an inorganic film of the upper hard mask 107. For this reason, an ashing process for removing the resist and the antireflection film in the via hole is not included, and excessive damage is not caused to the low dielectric constant films (the via interlayer film 103 and the trench interlayer film 105) on an interconnection trench sidewall and a via hole sidewall. Further, even if misalignment occurs to a via pattern of the photoresist at the time of via exposure for the interconnection trench pattern 107a of the upper hard mask 107, oxygen ashing can be performed to the photoresist without causing the low dielectric constant film to come in contact with a plasma. Consequently, a via exposure process can be repeated until the misalignment comes equal to or below a desired value.

The conventional technique of the dual hard mask method has many superior aspects to the first conventional technique of the via first method, in terms of damage reduction to the low dielectric constant film, and the avoidance of the via poisoning.

However, in the dual hard mask method, the misalignment trouble occurs, caused by the trench first process for forming the trench pattern firstly to the upper mask.

Details thereof are explained with reference to FIGS. 3A to 3I. In FIG. 3A, the interconnection trench pattern (the resist pattern 109a) is out of alignment by $\Delta D_3$ from the lower interconnection of the lower interconnection layer 101. On the other hand, in FIG. 3D, the via-hole pattern 111a is out of alignment by $\Delta D_4$ in an opposite direction from the lower interconnection mentioned above. As a result, as shown in FIG. 3H, the via hole is out of alignment by $\Delta D_3 + \Delta D_4$ from the upper interconnection. Therefore, in the case of a dense pitch interconnection, the via and the interconnection come close to each other, causing a risk of the short circuit.

Also, another problem is caused when the via-hole pattern formation in FIG. 3D is performed for the interconnection trench pattern 107a in order to avoid the risk of the short circuit. In this case, the via hole may be out of alignment by $\Delta D_3 + \Delta D_4$ from the lower interconnection. Therefore, it is expected that a via contact portion is reduced and the via resistance is increased, like a P region in FIG. 3I.

Thus, when using the dual hard mask method, it is impossible to avoid both the short circuit and the increase in the via resistance, even if via alignment is performed for the lower interconnection of the lower interconnection layer 101 and the hard mask pattern (the interconnection trench pattern 107a) for the interconnection trench formation. This is caused by the fact that the dual hard mask method is originally the trench first process, and cannot be avoided.

Further, also in the dual hard mask method, the interlayer film (the trench interlayer film 105) is bared at the time of the ashing after the via formation of FIG. 3E, and the ashing damage at this time cannot be avoided.

Thus, a focus on a multilayer interconnection configuration reveals that the problems of the etching residue and the ashing damage are caused in the via first method of the first conventional technique. In the dual hard mask method of the second conventional technique, the problem of the misalignment is caused. Technique is desired that forms a multilayer interconnection configuration having less damage to a low dielectric constant film. A technique is desired that can avoid problems caused by the misalignment such as the short circuit and the increase in the via resistance. Further, a technique is desired that can form a multilayer interconnection configuration superior in a via manufacturing yield.

In conjunction with the above description, a method of manufacturing a semiconductor device and the semiconductor device are disclosed in Japanese Laid Open Patent Application JP-P2002-43419A. This is a method of manufacturing a semiconductor device in which a first interconnection and a second interconnection thereon are formed on a semiconductor substrate, and a through hole is formed between the first and second interconnections. An insulating film deposition process, a deposition process of a multilayer hard mask layer, a first opening forming process, a second opening forming process, a third opening forming process, and an interconnection trench for the second-interconnection/the through hole forming process, are included.

The insulating film deposition process forms in order as an interlayer films on the first interconnection, a first insulating film functioning as an anti-diffusion film of interconnection metal of the first interconnection, and a second insulating film that includes a low dielectric constant film layer, when forming the second interconnection and the through hole. The deposition process of a multilayer hard mask layer includes an insulating hard mask layer of at least three layers formed on the second insulating film, where the three layers as the insulating hard mask layer is a multilayer hard mask layer of which etching rate is different from each other under the same etching condition. Then, a first insulating hard mask layer, a second insulating hard mask layer, and a third insulating hard mask layer are formed in order, on the second insulating film. The first opening forming process etches the third and the second hard mask layers to form the first opening, which is a through hole pattern, on the first hard mask through self-alignment. The second opening forming process etches the third hard mask layer to form the second opening connected to the first opening on the second hard mask layer. Here, the second opening is the interconnection trench pattern of the second interconnection. The third opening forming process has a step of etching the first hard mask layer and a step of etching the second insulating film, by using the second hard mask layer as an etching mask to form a third opening connected to the first and second openings for baring the first insulating layer. The interconnection trench for the second-interconnection/the through hole forming process etches the upper parts of the second hard mask layer, the first hard mask layer and the second insulating film by using the third hard mask layer as the etching mask to form the interconnection trench for the second interconnection, and etches the first insulating layer to open a through hole for baring the first interconnection.

In the insulating film deposition process, a first low dielectric constant layer, an electrically insulating etching stopper layer having the same composition as that of the second hard mask layer and a second low dielectric constant layer may be formed in order, with respect to the second insulating film that includes a low dielectric constant layer. The third opening forming process may have a step of etching the first hard mask layer to bare the second low dielectric constant layer by using the second hard mask layer as an etching mask, a step of etching the second low dielectric constant layer to bare the etching stopper layer, and a step of etching the etching stopper layer. In the interconnection trench/through hole forming process, the second hard mask layer, the first hard mask layer, and the second low dielectric constant layer may be etched by using the third hard mask layer as an etching mask to bare the etching stopper layer and form the interconnection trench of the second interconnection. Further, the first insulating film may be etched to open a through hole for baring the first interconnection.

In conjunction with the above description, a method of manufacturing a semiconductor device is disclosed in Japanese Laid Open Patent Application JP-P2002-64139A. The manufacturing method of the semiconductor device forms an interconnection of a dual-damascene configuration. The manufacturing method includes (a) a process of embedding a first barrier layer and a lower interconnection in a first trench pattern formed to a first insulating layer on a substrate, (b) a process of forming a second insulating layer to an upper layer of the lower interconnection, (c) a process of forming a second trench pattern on an upper part of the second insulating layer by etching using a first resist pattern as a mask, (d) a process of forming a hole pattern that reaches the first barrier layer, to a lower part of the second insulating layer and to the lower interconnection by etching using a second resist pattern as a mask, and (e) a process of embedding a second barrier layer and an upper interconnection in the second trench pattern and the hole pattern.

In conjunction with the above description, a semiconductor device and a method of manufacturing the same are disclosed in Japanese Laid Open Patent Application JP-P2003-45964A. The semiconductor device includes an interlayer insulating film formed to cover a lower interconnection; and a via plug and an upper interconnection formed at the same time to a via hole and an interconnection trench respectively, which are formed to the interlayer insulating film; wherein the lower interconnection is connected with the upper interconnection through the via plug. The interlayer insulating film is formed by an insulating film of a low dielectric constant, and is covered with a hard mask. The interlayer insulating film may be formed by an organic layer.

In conjunction with the above description, a semiconductor device and a manufacturing method of the same are disclosed in Japanese Laid Open Patent Application JP-P2003-133411A. In the semiconductor device, an interlayer insulating film on a substrate in which semiconductor elements are formed includes a first organic insulating film; a first insulating film, which is different from the organic insulating film, formed on the first organic insulating film; a second organic insulating film formed on the first insulating film; and a second insulating film, which is different from the organic insulating film, formed on the second organic insulating film. The semiconductor device has an interconnection trench formed to the second insulating film and a part of the second organic insulating film at least, and has a contact hole that is at least connected to the bottom of the interconnection trench, formed across the first insulating film and the first organic insulating film. A third organic insulating film may be formed on the second insulating film, and the interconnection trench may be formed across the third organic insulating film, the second insulating film, and at least a part of the second organic insulating film.

In conjunction with the above description, an interconnection configuration and a method of manufacturing the same are disclosed in Japanese Laid Open Patent Application JP-P2003-163265A. A configuration of a trench interconnection formed to an insulating film on a semiconductor substrate is disclosed. A trench interconnection having a minimum line width in one interconnection layer, is connected to a lower interconnection through a via hole having the same value of a bore diameter as that of the minimum line width. A trench interconnection having the minimum line width or above in the interconnection layer, is connected to the lower interconnection through a via hole having a value of a bore diameter larger than that of the minimum line width.

SUMMARY OF THE INVENTION

Therefore, an object of the present invention is to provide a technique of a semiconductor device and a method of manufacturing the semiconductor device, capable of forming a multilayer interconnection configuration causing less damage to a low dielectric constant film.

Another object of the present invention is to provide a technique of a semiconductor device and a method of manufacturing the semiconductor device, capable of avoiding problems caused by misalignment such as a short-circuit and an increase in via resistance.

Further, another object of the present invention is to provide a technique of a semiconductor device and a method of manufacturing the semiconductor device, capable of forming a multilayer interconnection configuration superior in a via manufacturing yield.

These objects, other objects, and benefits of the present invention can be easily understood from the description given below and the attached drawings.

In order to achieve an aspect of the present invention, the present invention provides a semiconductor device including a first interconnection layer and a interlayer insulating layer. The first interconnection layer is formed on a upper side of a substrate, and includes a first interconnection. The interlayer insulating layer is formed on the first interconnection layer, and includes a via connected with the first interconnection at one end of the via and a second interconnection connected with the via at another end of the via. The interlayer insulating layer has a relative dielectric constant lower than that of a silicon oxide film. An upper portion of the interlayer insulating layer includes a silicon oxide film, a silicon nitride film and a silicon oxide film in order from a lower portion.

In the semiconductor device, at least one of a portion corresponding to a sidewall of the via and a portion corresponding to a sidewall of the second interconnection in the interlayer insulating layer may be in at least one of a nitrided state and a carbonized state.

In the semiconductor device, the interlayer insulating layer may be a film including silicon, carbon, oxygen and hydrogen.

In the semiconductor device, an insulating film having a certain compactness may be formed in at least one of an area between the interlayer insulating layer and the via and an area between the interlayer insulating layer and the second interconnection.

In the semiconductor device, the interlayer insulating layer may include a first interlayer insulating layer which includes the via, and a second interlayer insulating layer which includes the second interconnection. A material of the first interlayer insulating layer may be different from that of the second interlayer insulating layer.

The semiconductor device, may further include an etching stopper layer which formed between the first interlayer insulating film and the second interlayer insulating film.

In order to achieve another aspect of the present invention, the present invention provides a method of manufacturing a semiconductor device, including steps of (a) to (g). The step (a) is a step of forming a inter layer insulating film, a first silicon oxide film, a silicon nitride film and a second silicon oxide film in order on a first interconnection layer formed on a upper side of a substrate and including a first interconnection. The step (b) is a step of forming a via hole resist pattern on the second silicon oxide film, etching the second silicon oxide film and the silicon nitride film, and removing the via hole resist pattern by oxygen plasma. The step (c) is a step of forming a trench resist pattern on the second silicon oxide film, etching the second silicon oxide film, and removing the trench resist pattern by oxygen plasma. The step (d) is a step of etching the first silicon oxide film and a part of the interlayer insulating film with the silicon nitride film as a mask. The step (e) is a step of etching the silicon nitride film and the first silicon oxide film with the second silicon oxide film as a mask. The step (f) is a step of etching the interlayer insulating film with the second silicon oxide film as a mask to simultaneously form structures to be an interconnection trench and a via hole in the interlayer insulating film. The step (g) is a step of embedding conductors in the interconnection trench and the via hole.

In the method of manufacturing a semiconductor device, the interlayer insulating film may be a film including silicon, carbon, oxygen and hydrogen. In at least one of the step (d) and the step (f), the interlayer insulating film may be etched by using a mixed gas plasma to which 40% or more of a nitrogen gas, 40% or more of a fluorocarbon gas and a certain ration of an oxygen gas are added.

In the method of manufacturing a semiconductor device, the step (g) may include (g1) forming an insulating layer having a certain compactness in a bottom and a sidewall of the interconnection trench and the via hole.

In the method of manufacturing a semiconductor device, the step (g) may be include (g2) removing the second silicon oxide film.

In order to achieve another aspect of the present invention, the present invention provides a method of manufacturing a semiconductor device, including steps of (h) to (o). The step (h) is a step of forming a first inter layer insulating film, a interlayer silicon oxide film, a second interlayer insulating film, a first silicon oxide film, a silicon nitride film and a second silicon oxide film in order on a first interconnection layer formed on a upper side of a substrate and including a first interconnection. The step (i) is a step of forming a via hole resist pattern on the second silicon oxide film, etching the second silicon oxide film and the silicon nitride film, and removing the via hole resist pattern by oxygen plasma. The step (j) is a step of forming a trench resist pattern on the second silicon oxide film, etching the second silicon oxide film, and removing the trench resist pattern by oxygen plasma. The step (k) is a step of etching the first silicon oxide film and the second interlayer insulating film with the silicon nitride film as a mask, and stopping the etching on the interlayer silicon oxide film. The step (l) is a step of etching the silicon nitride film and the first silicon oxide film with the second silicon oxide film as a mask. The step (m) is a step of etching the first silicon oxide film and the interlayer silicon oxide film at the same time. The step (n) is a step of etching the second interlayer insulating film and the first interlayer insulating film with the second silicon oxide film as a mask to simultaneously form structures to be an interconnection trench in the second interlayer insulating film and a via hole in the first interlayer insulating film. The step (o) is a step of embedding conductors in the interconnection trench and the via hole.

In the method of manufacturing a semiconductor device, at least one of the first interlayer insulating film and the second interlayer insulating film may be a film including silicon, carbon, oxygen and hydrogen. The interlayer insulating films may be etched by using a mixed gas plasma to which 40% or more of a nitrogen gas, 40% or more of a fluorocarbon gas and a certain ration of an oxygen gas are added.

In the method of manufacturing a semiconductor device, the step (o) may include (o1) forming an insulating layer having a certain compactness in a bottom and a sidewall of the interconnection trench and the via hole.

In the method of manufacturing a semiconductor device, the step (o) may include (o2) removing the second silicon oxide film.

In order to achieve another aspect of the present invention, the present invention provides a method of manufacturing a semiconductor device, including steps of (p) to (w). The step (p) is a step of forming a first inter layer insulating film, a interlayer silicon oxide film, a second interlayer insulating film, a first silicon oxide film, a first silicon nitride film, a second silicon oxide film and a second silicon nitride film in order on a first interconnection layer formed on a upper side of a substrate and including a first interconnection. The step (q) is a step of forming a via hole resist pattern on the second silicon nitride film, etching the second silicon nitride film, the second silicon oxide film and the first silicon nitride film, and removing the via hole resist pattern by oxygen plasma. The step (r) is a step of forming a trench resist pattern on the second silicon nitride film, etching the second silicon nitride film and the second silicon oxide film, and removing the trench resist pattern by oxygen plasma. The step (s) is a step of etching the first silicon oxide film and the second interlayer insulating film with the second silicon nitride film as a mask, and stopping the etching on the interlayer silicon oxide film. The step (t) is a step of etching the first silicon nitride film and the first silicon oxide film with the second silicon nitride film and the second silicon oxide film as a mask. The step (u) is a step of etching the first silicon oxide film and the interlayer silicon oxide film at the same time. The step (v) is a step of etching the second interlayer insulating film and the first interlayer insulating film with the first silicon nitride film as a mask to simultaneously form structures to be an interconnection trench in the second interlayer insulating film and a via hole in the first interlayer insulating film. The step (w) is a step of embedding conductors in the interconnection trench and the via hole.

In the method of manufacturing a semiconductor device, at least one of the first interlayer insulating film and the second interlayer insulating film may be a film including silicon, carbon, oxygen and hydrogen. The interlayer insulating films may be etched by using a mixed gas plasma to which 40% or more of a nitrogen gas, 40% or more of a fluorocarbon gas and a certain ration of an oxygen gas are added.

In the method of manufacturing a semiconductor device, the step (w) may include (w1) forming an insulating layer having a certain compactness in a bottom and a sidewall of the interconnection trench and the via hole.

BRIEF DESCRIPTION OF THE DRAWINGS

FIG. 1E is a view showing a method of manufacturing the dual-damascene interconnection configuration of the first conventional technique;

FIG. 1F is a view showing a method of manufacturing the dual-damascene interconnection configuration of the first conventional technique;

FIG. 1G is a view showing a method of manufacturing the dual-damascene interconnection configuration of the first conventional technique;

FIG. 3E is a view showing a method of manufacturing the dual-damascene interconnection configuration of the second conventional technique;

FIG. 3F is a view showing a method of manufacturing the dual-damascene interconnection configuration of the second conventional technique;

FIG. 3G is a view showing a method of manufacturing the dual-damascene interconnection configuration of the second conventional technique;

FIG. 3H is a view showing a method of manufacturing the dual-damascene interconnection configuration of the second conventional technique;

FIG. 3I is a view showing a method of manufacturing the dual-damascene interconnection configuration of the second conventional technique;

DESCRIPTION OF THE PREFERRED EMBODIMENTS

A method of manufacturing a semiconductor device of the present invention employs a process using a hard mask of three layers, in forming a dual-damascene configuration. For example, a silicon oxide film is used as an upper hard mask, a silicon nitride film is used as an intermediate hard mask, and a silicon oxide film is used as a lower hard mask. A SiOCH-series low dielectric constant insulating film is used at least for either of an interlayer film for a via hole and an interlayer film for an interconnection trench. Etching of the interlayer film is performed by using a mixed gas plasma of 40% or more of a nitrogen gas and 40% or more of a fluorocarbon gas with the addition of an oxygen gas. This etching method was discovered by the inventors of the present invention, and is capable of setting an etching selection ratio between the SiOCH-series low dielectric constant insulating film and the silicon oxide film, to 5 or more. These methods make it possible to realize dual-damascene configuration formation that is easier and is higher in accuracy, compared with a method of forming a dual-damascene configuration using a three-layer hard mask shown in Japanese Laid Open Patent Application P2002-P43419A.

Figure 1A:
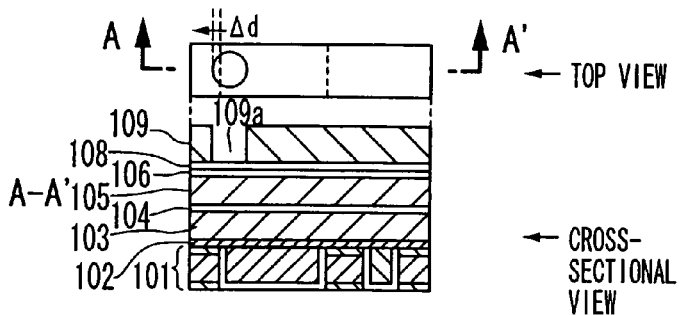
FIG. 1A is a view showing a method of manufacturing a dual-damascene interconnection configuration of a first conventional technique.
Figure 1B:
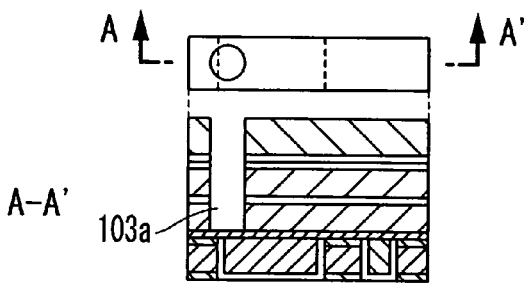
FIG. 1B is a view showing a method of manufacturing the dual-damascene interconnection configuration of the first conventional technique.
Figure 1C:
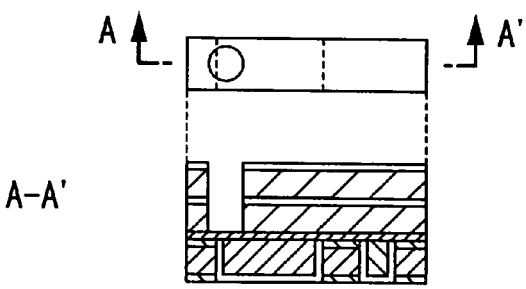
FIG. 1C is a view showing a method of manufacturing the dual-damascene interconnection configuration of the first conventional technique.
Figure 1D:
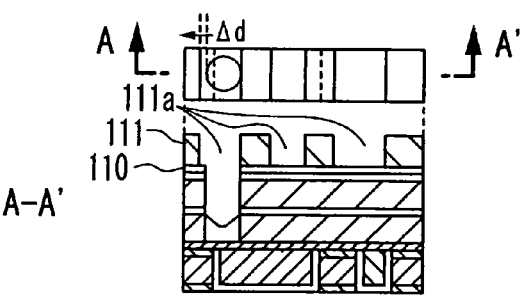
FIG. 1D is a view showing a method of manufacturing the dual-damascene interconnection configuration of the first conventional technique.
Figure 2:
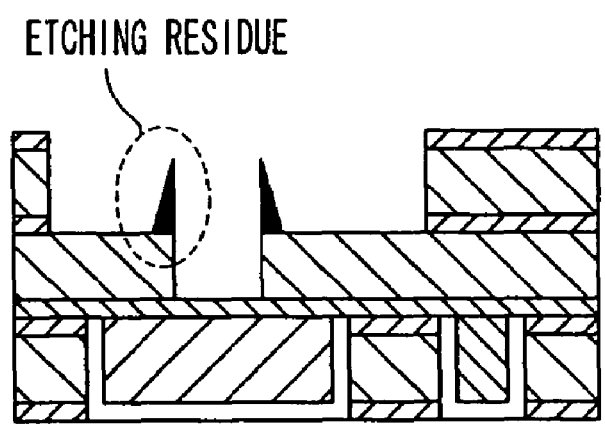
FIG. 2 is a cross-sectional view showing generation of an etching residue in a via first process of the conventional technique.
Figure 3A:
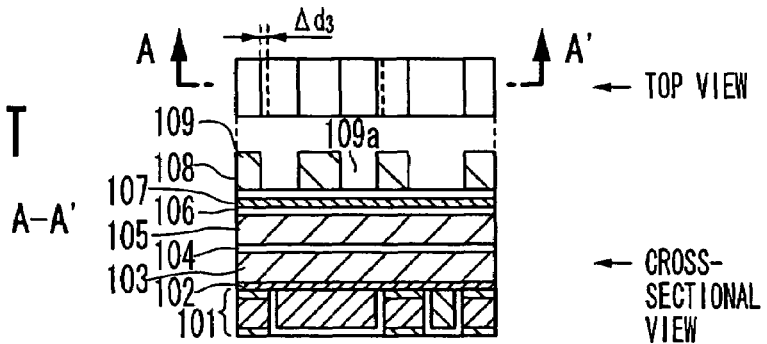
FIG. 3A is a view showing a method of manufacturing a dual-damascene interconnection configuration of a second conventional technique.
Figure 3B:
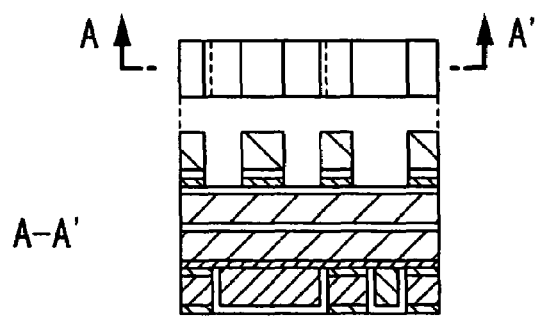
FIG. 3B is a view showing a method of manufacturing the dual-damascene interconnection configuration of the second conventional technique.
Figure 3C:
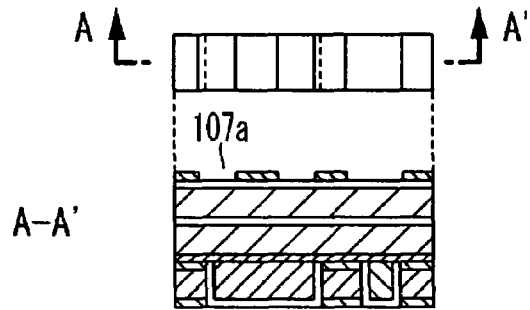
FIG. 3C is a view showing a method of manufacturing the dual-damascene interconnection configuration of the second conventional technique.
Figure 3D:
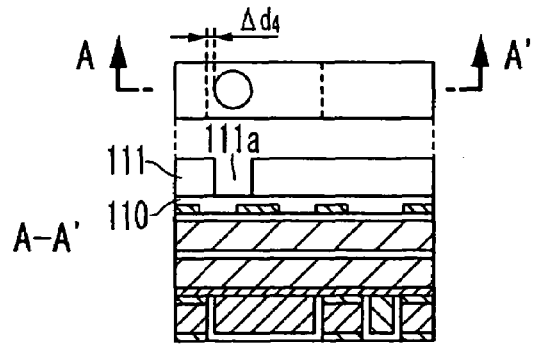
FIG. 3D is a view showing a method of manufacturing the dual-damascene interconnection configuration of the second conventional technique.
Figure 4:
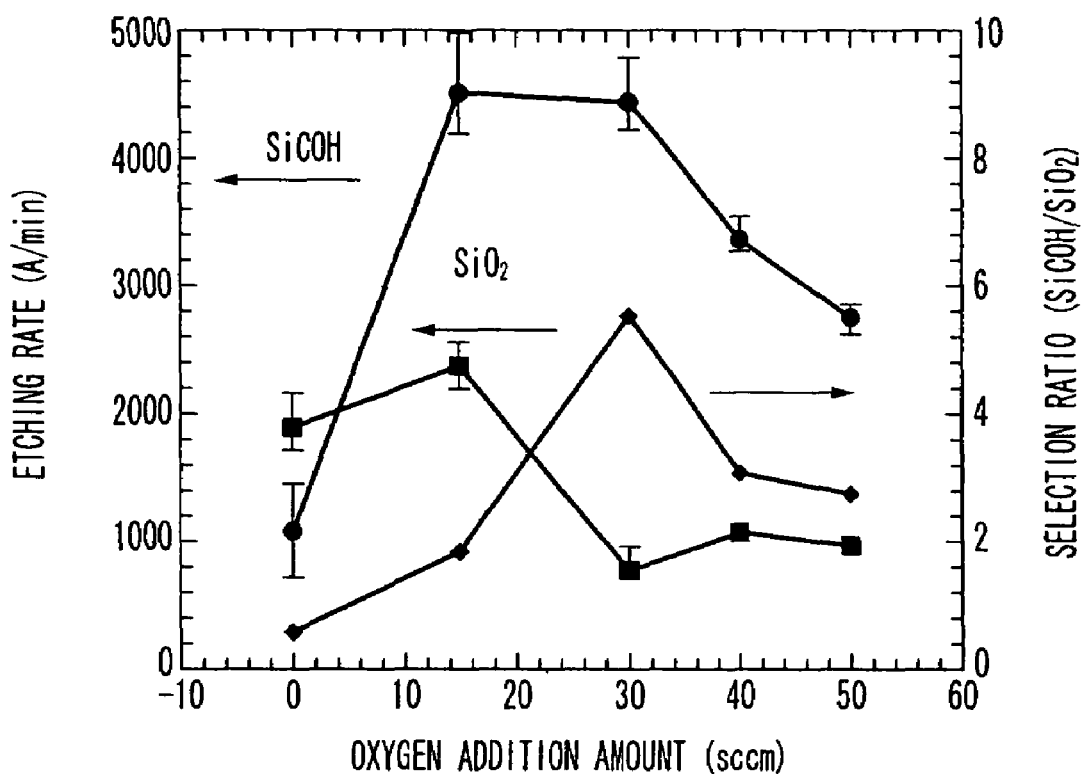
FIG. 4 is a graph showing oxygen addition amount dependence in an etching rate of a SiOCH film and a $SiO_2$ film.

FIG. 4 is a graph showing oxygen addition amount dependence in an etching rate of a SiOCH film and a $SiO_2$ film. The vertical axis on the left indicates the etching rate (angstrom/min.) of the SiOCH film and the $SiO_2$ film. The vertical axis on the right indicates a selection ratio (etching rate of the SiOCH film/etching rate of the $SiO_2$ film). The horizontal axis indicates an oxygen addition amount (sccm) in an etching gas (the nitrogen gas+the fluorocarbon gas). Regarding the $SiO_2$ film, oxygen desorption on a surface is supplemented when the oxygen addition amount is increased. As a result, the etching rate drops. Regarding the SiOCH film however, carbon on the surface is easily-removable when the oxygen addition amount is increased. Therefore, the etching rate increases up to a point of a certain degree of the oxygen addition amount. By etching with that oxygen content, high selection etching of SiOCH is possible. Also, since the surface of the SiOCH film is nitrided to become a carbonitride film by adding a large amount of the nitrogen gas, damage to SiOCH can be reduced. That is, the high selection etching of the SiOCH film is possible while reducing the damage to the SiOCH film as the interlayer film.

The embodiments of the semiconductor device and the method of manufacturing the semiconductor device of the present invention will be described in detail below with reference to the attached drawings.

First Embodiment

With a Stopper

FIGS. 5A to 5K are schematic views showing the first embodiment of a method of manufacturing a semiconductor device of the present invention. In each of Figures, the upper part is a top view, and the lower part is an AA cross-sectional view of the top view.

The first embodiment provides a dual-damascene configuration of a SiOCH film, which uses a three-layer hard mask of silicon oxide film/silicon nitride film/silicon oxide film, and provides a silicon oxide film as an etching stopper in a trench bottom.

Figure 5A:
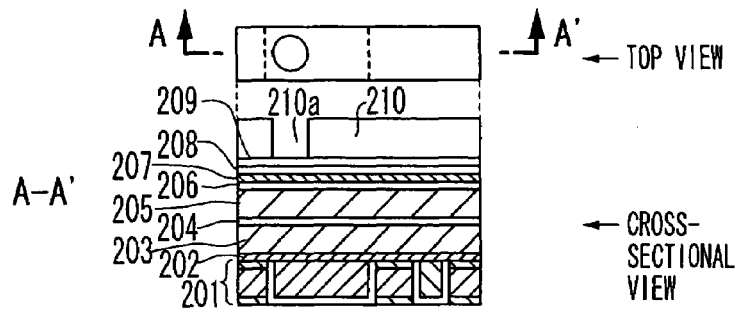
FIG. 5A is schematic view showing a first embodiment of a method of manufacturing a semiconductor device of the present invention.

As shown in FIG. 5A, a silicon carbonitride film 202, as a cap film that includes a first inorganic film, is formed on a lower interconnection layer 201 of a semiconductor substrate having a lower interconnection. A SiOCH film 203, which is a low dielectric constant insulating film, is formed thereon corresponding to a depth of a via hole as a first interlayer film, with a plasma CVD method. A silicon oxide film 204, which is a second inorganic film, is formed on the SiOCH film 203, as an etching stopper for a trench portion. A SiOCH film 205, which is a low dielectric constant insulating film, is formed corresponding to a depth of an upper interconnection, on the silicon oxide film 204 that is the second inorganic film, with the plasma CVD method. A silicon oxide film 206, which is a third inorganic film, is formed on the SiOCH film 205, as a bottom film (bottom hard mask) of a triple hard mask. Further, a silicon nitride film 207 as the third inorganic film, is formed on the silicon oxide film 206, as an intermediate film (intermediate hard mask) of the triple hard mask. A silicon oxide film 208 is further formed on the silicon nitride film 207 as a top film (top hard mask) of the triple hard mask. On the silicon oxide film 208, an antireflection film layer 209 and a first photoresist layer 210 are formed. Then, a via-hole pattern 210a is formed to the first photoresist layer 210 by using a photolithography technique.

Figure 5B:
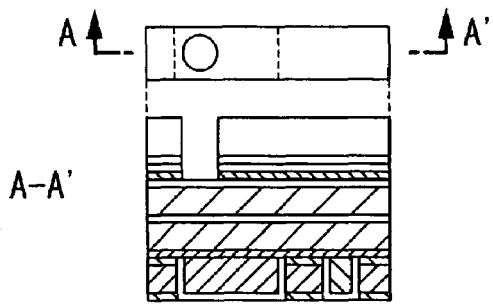
FIG. 5B is schematic view showing a first embodiment of a method of manufacturing a semiconductor device of the present invention.
Figure 5C:
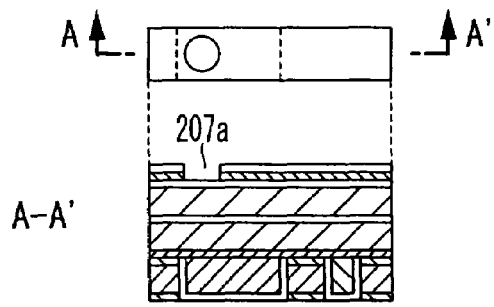
FIG. 5C is schematic view showing a first embodiment of a method of manufacturing a semiconductor device of the present invention.

As shown in FIG. 5B, the antireflection film 209, the silicon oxide film 208, and the silicon nitride film 207 are etched in order with the photoresist layer 210 as a mask, by using a fluorine-series plasma. As shown in FIG. 5C, the first photoresist layer 210 and the antireflection film 209 are removed by using an oxygen plasma. At this time, the silicon oxide film 206, which is the bottom hard mask, is present at the bottom of the via-hole pattern 207a formed to the top hard mask (silicon oxide film 208) and the intermediate hard mask (silicon nitride film 207). Therefore, the SiOCH film 205 is not etched at the time of the above etching. In addition, the SiOCH film 205 is not etched even if oxygen radical ashing is used to remove the photoresist layer 210, owing to protection of the silicon oxide film 206. In this case, the photoresist can be removed through ashing while the silicon oxide film 208 to be the top hard mask has the edges hardly being rounded.

Figure 5D:
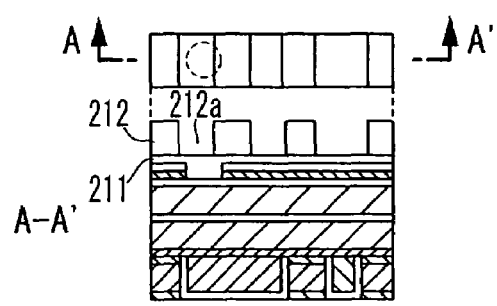
FIG. 5D is schematic view showing a first embodiment of a method of manufacturing a semiconductor device of the present invention.

As shown in FIG. 5D, an antireflection film 211 and a second photoresist layer 212 are again formed to cover the silicon oxide film 208 and the silicon oxide film 206 of the via-hole pattern 207a. After that, an interconnection trench pattern 212a is formed to the second photoresist layer 212 by using the photolithography technique.

Figure 5E:
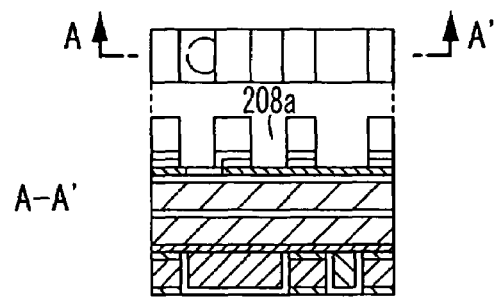
FIG. 5E is schematic view showing a first embodiment of a method of manufacturing a semiconductor device of the present invention.
Figure 5F:
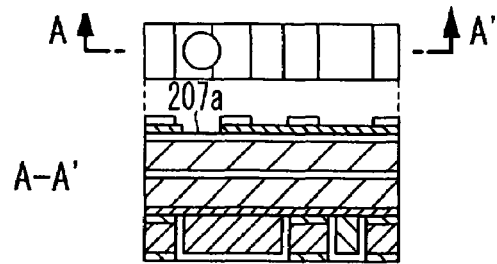
FIG. 5F is schematic view showing a first embodiment of a method of manufacturing a semiconductor device of the present invention.

As shown in FIG. 5E, the antireflection film 211 and the silicon oxide film 208 are etched, with the second photoresist layer 212 as a mask. As a result, a via-hole pattern 208a is formed. At this time, the silicon oxide film 206 is not etched since the antireflection film 211 embeds the via-hole pattern 207a. As shown in FIG. 5F, the second photoresist layer 212 and the antireflection film 211 are removed with the oxygen plasma. At this time, the SiOCH film 205 is not etched because of the three-layer hard mask thereon. In addition, it is possible to use the oxygen radial ashing for the removal of the photoresist layer 212. In this case, the silicon oxide film 208 to be the top hard mask, has the edges hardly being rounded, and the photoresist can be removed through ashing.

Figure 5G:
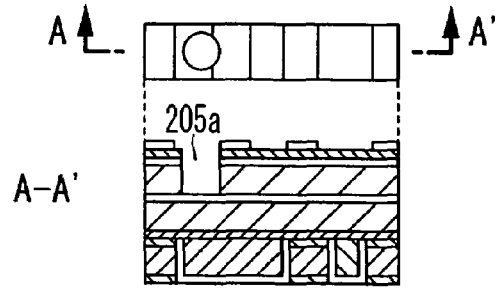
FIG. 5G is schematic view showing a first embodiment of a method of manufacturing a semiconductor device of the present invention.

As shown in FIG. 5G, the silicon oxide film 206, which is the bottom hard mask, is etched, with the silicon nitride film 207 having the via-hole pattern 207a as a mask. Subsequently, the SiOCH film 205 under the silicon oxide film 206 is etched with a plasma of a mixed gas containing 40% or more of a nitrogen gas and 40% or more of a $CHF_3$ (fluorocarbon) gas with an appropriate amount of an oxygen gas. The etching is stopped at the silicon oxide film 204 as the etching stopper, and a half via hole 205.a is formed. At this time, the silicon oxide film 208, which is the top hard mask, is hardly etched, since as election ratio between the SiOCH film 205 and the silicon oxide film 208 is 5 or more.

Figure 5H:
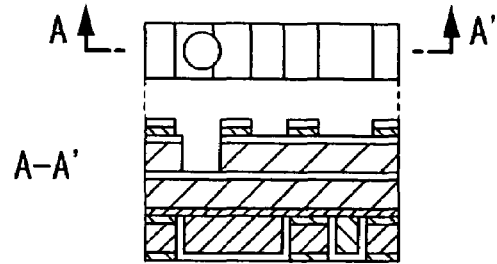
FIG. 5H is schematic view showing a first embodiment of a method of manufacturing a semiconductor device of the present invention.
Figure 5I:
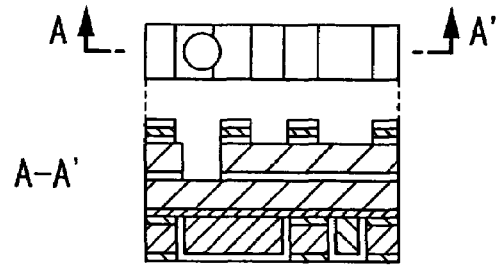
FIG. 5I is schematic view showing a first embodiment of a method of manufacturing a semiconductor device of the present invention.

As shown in FIG. 5H, the silicon nitride film (SiN) 207, which is the intermediate hard mask, is etched, with the silicon oxide film 208, which is the top hard mask, as a mask. As shown in FIG. 5I, the silicon oxide film ($SiO_2$) 206, which is the bottom hard mask, is etched. At this time, the silicon oxide film 204 as the etching stopper at the bottom of the half via hole 205a is etched at the same time.

Figure 5J:
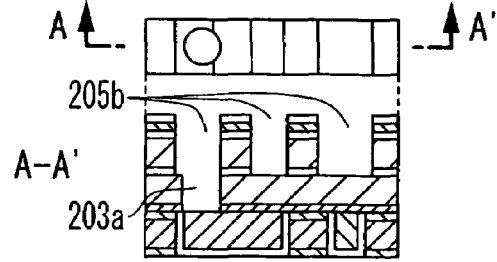
FIG. 5J is schematic view showing a first embodiment of a method of manufacturing a semiconductor device of the present invention.

As shown in FIG. 5J, the SiOCH film 205 under the silicon oxide film 206 is etched with the plasma of the mixed gas containing 40% or more of the nitrogen gas and 40% or more of the $CHF_3$ gas with an appropriate amount of the oxygen gas, to form an interconnection trench pattern 205b. At the same time, the SiOCH film 203 under the half via hole 205a is etched simultaneously, and a half via hole 203a is formed. As a result, the dual-damascene configuration is formed. At this time, a SiOCH sidewall is carbonitrided, and damage to the SiOCH films (203 and 205) in later processes can be reduced. After that, by performing etch back to the cap film 202, which is the first inorganic film, a configuration can be obtained in which the interconnection trench (interconnection trench pattern 205b) is formed to the triple hard mask (206 to 208) and the SiOCH film 205, and the via hole (half via hole 203a) is formed to the SiOCH film 203.

Figure 5K:
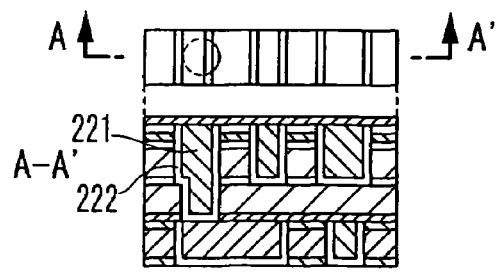
FIG. 5K is schematic view showing a first embodiment of a method of manufacturing a semiconductor device of the present invention.

As shown in FIG. 5K, the copper interconnections are formed in the low dielectric constant interlayer film, by embedding a barrier film 222 and a copper film 221 at one time in the interconnection trench (interconnection trench pattern 205b) and the via hole (half via hole 203a), and performing chemical-mechanical polishing. At this time, the silicon oxide film 208 is polished with the silicon nitride film 207 as a CMP stopper. The presence of this stopper secures interconnection depth without in-plane distribution and pattern dependence. Additionally, polishing may be stopped at the silicon oxide film 208, or may be performed up to the silicon oxide film 206. FIG. 5K shows an example of stopping the polishing at the silicon oxide film 208.

Electrical properties of a two-layer copper interconnection formed in the SiOCH film by using each of the triple hard mask method of the present invention, the dual hard mask method of the second conventional technique, and the single-damascene method of the first conventional technique, were compared.

Figure 6A:
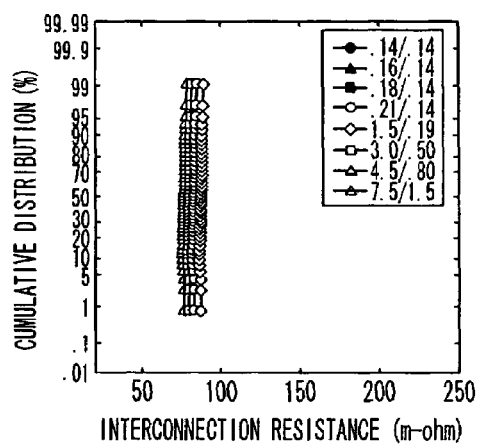
FIG. 6A is a graph showing a relationship between each manufacturing method and a wafer in-plane cumulative distribution of each interconnection resistance.
Figure 6B:
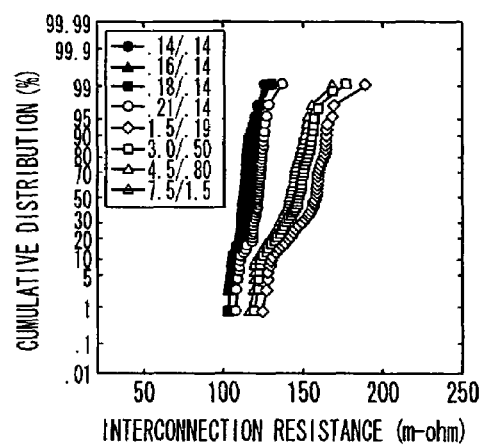
FIG. 6B is a graph showing the relationship between each manufacturing method and the wafer in-plane cumulative distribution of each interconnection resistance.
Figure 6C:
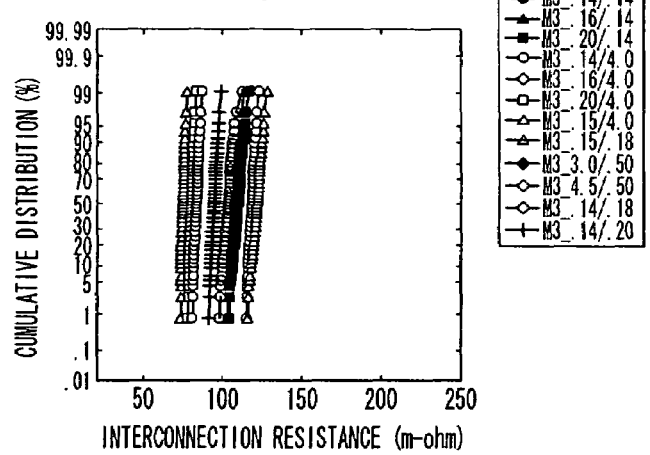
FIG. 6C is a graph showing the relationship between each manufacturing method and the wafer in-plane cumulative distribution of each interconnection resistance.

FIGS. 6A to 6C are graphs showing the relationship between each manufacturing method and a wafer in-plane cumulative distribution of each interconnection resistance. FIG. 6A shows the case of using the triple hard mask method as the manufacturing method. FIG. 6B shows the case of using the dual hard mask method as the manufacturing method. FIG. 6C shows the case of using the single-damascene method as the manufacturing method. The vertical axis shows a cumulative distribution (%) at a measurement point in a single wafer. The horizontal axis shows an interconnection resistance (mΩ) at each measurement point. Each curved line shows a kind of a pattern configuration. For example, "0.14/0.14" shows an interconnection pattern configuration of a 0.14 µm interconnection and a 0.14 µm space.

As shown in FIG. 6A, the interconnection resistance is approximately 80 mΩ in the triple hard mask method of the present invention. A curved line is approximately vertical to the horizontal axis, showing that in-plane variations are small. Each of the curved lines is approximately in the same position being the same curved line, showing that shift by the pattern is small. On the other hand, as shown in FIG. 6B, the in-phase variations are large (a curving degree of the curved line is large) and the shift by the patterns is also large (curved lines do not overlap each other), in the case of the conventional dual hard mask method. Additionally, as shown in FIG. 6C, the in-phase variations (the curving degree of the curved line) exist, and the shift by the pattern is large (curved lines do not overlap each other), in the case of the conventional single-damascene method. Superiority of FIG. 6A over FIGS. 6B and 6C results from the fact the interconnection depth is uniform in the pattern and the plane because the intermediate hard mask SiN is a CMP stopper of high accuracy in the triple hard mask method of the present invention.

Comparison was made on generation of a leak current of the interconnection in each manufacturing method of the triple hard mask method of the present invention and the dual hard mask method of the second conventional technique. An interconnection was used in which a via of 0.14 µmø is closely connected to an interconnection of a 0.14 µm width and a 0.28 µm pitch.

Figure 7:
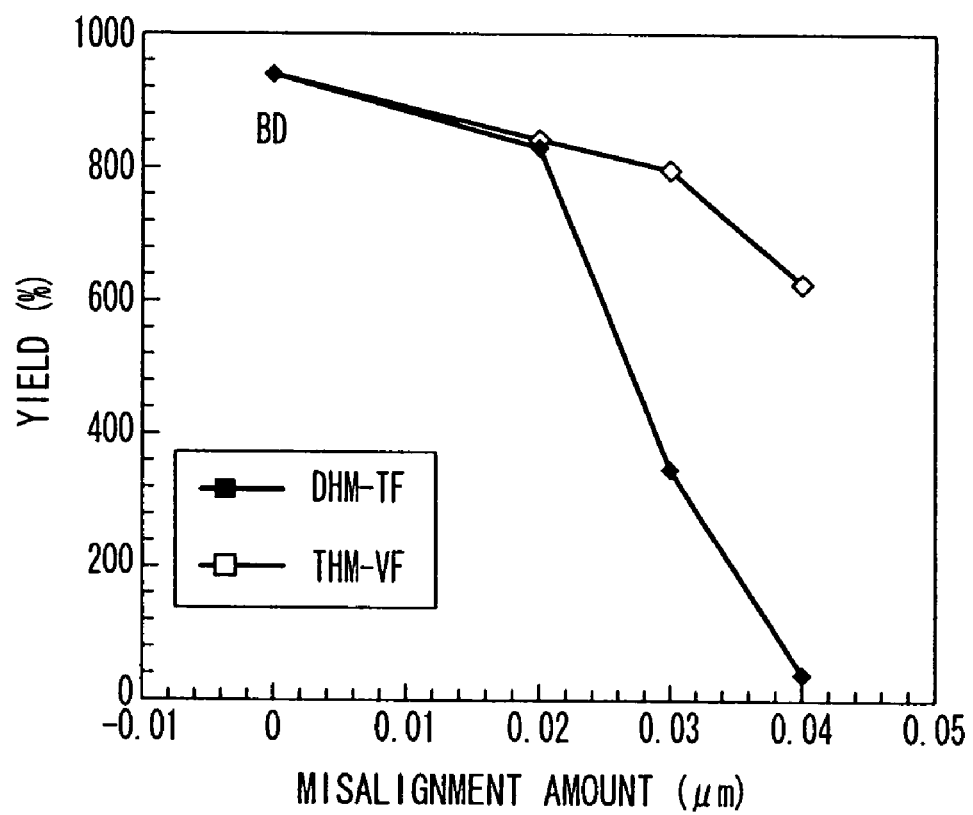
FIG. 7 is a graph showing a relationship between a misalignment amount and a manufacturing yield in a triple hard mask method and a dual hard mask method.

FIG. 7 is a graph showing the relationship between a misalignment amount and a manufacturing yield in each of the manufacturing methods of the triple hard mask method and the dual hard mask method. The horizontal axis shows an amount (a misalignment amount: µm) of misaligning a via and an interconnection. The vertical axis shows a manufacturing yield (a via yield: %) of a via evaluated based on the presence of the leak current occurrence.

In the dual hard mask method (curved line: DHM-TF), a significant drop in the yield occurs starting from the misalignment exceeding 0.02 µm. On the other hand, the drop in the yield is small in the triple hard mask method (curved line: THM-VF). This shows that the triple hard mask method can provide an interconnection that has a higher misalignment margin of the upper interconnection and the via hole, and can form a high-reliability interconnection.

Thus, by using the triple hard mask method of the present invention, an interconnection can be formed that has the interconnection depth without in-plane distribution and pattern dependence, because the intermediate hard mask SiN is the CMP stopper. Since an inflow process of the photoresist and the antireflection film into the via as seen in the via first method is not included, the via poisoning and the damage degradation of the low dielectric constant insulating film in repeated photolithography is not caused. Also, because of the via first process, the margin for the via misalignment is large and the high-reliability interconnection is provided.

In the above embodiment, the example of using the SiOCH film as a low dielectric constant film is shown. However, it is not limited to the SiOCH film, if a similar process is possible. Also, a combination is not limited to that of the silicon oxide film and the silicon nitride film, if the combination can make the selection ratio large, of the upper hard mask and the intermediate hard mask, and the intermediate hard mask and the lower hard mask. Further, the example of using the silicon carbonitride film for the stopper as the second inorganic film and for the cap film as the first inorganic film, is shown. However, it is not specifically limited to the silicon carbonitride film, and material having interchangeable properties may be used as well.

Second Embodiment

Without Stopper

FIGS. 8A to 8K are schematic views showing the second embodiment of the method of the manufacturing the semiconductor device of the present invention. In each of Figures, the upper part is a top view, and the lower part is an AA cross-sectional view of the top view.

The second embodiment is different from the first embodiment in that the second embodiment does not use the silicon oxide film 204 as the second inorganic film in the first embodiment.

Figure 8A:
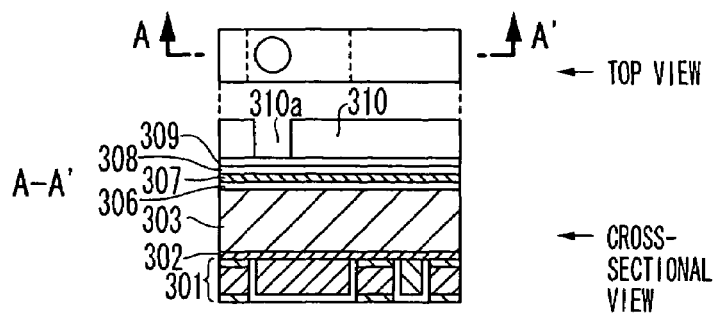
FIG. 8A is schematic view showing a second embodiment of the method of the manufacturing the semiconductor device of the present invention.

As shown in FIG. 8A, a silicon carbonitride film 302 is formed as a cap film that includes a first inorganic film, on a lower interconnection layer 301 of a semiconductor substrate having a lower interconnection. A SiOCH film 303, which is a low dielectric constant insulating film, is formed thereon as a first interlayer film, corresponding to a depth of a via hole and an upper interconnection, with a plasma CVD method. On the SiOCH film 303, a silicon oxide film 306, which is a second inorganic film, is formed as a bottom film (lower hard mask) of a triple hard mask. Further, on the silicon oxide film 306, a silicon nitride film 307 as a third inorganic film, is formed as an intermediate film (intermediate hard mask) of the triple hard mask. In addition, on the silicon nitride film 307, a silicon oxide film 308 is formed as a top film (upper hard mask) of the triple hard mask. On the silicon oxide film 308, an antireflection film layer 309 and a first photoresist layer 310 are formed. Then, a via-hole pattern 301a is formed to the first photoresist layer 310 by using the photolithography technique.

Figure 8B:
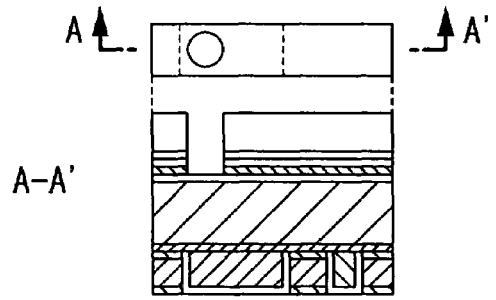
FIG. 8B is schematic view showing the second embodiment of the method of the manufacturing the semiconductor device of the present invention.
Figure 8C:
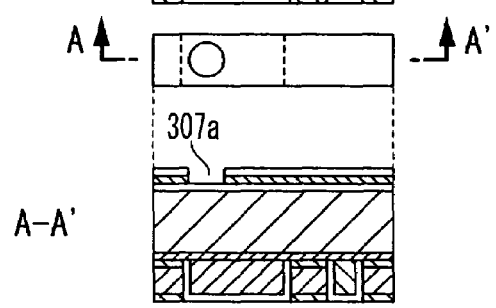
FIG. 8C is schematic view showing the second embodiment of the method of the manufacturing the semiconductor device of the present invention.

As shown in FIG. 8B, the antireflection film 309, the silicon oxide film 308, and the silicon nitride film 307 are etched in order with the photoresist layer 310 as a mask, by using a fluorine-series plasma. As shown in FIG. 8C, the first photoresist layer 310 and the antireflection film 309 are removed with an oxygen plasma. At this time, the silicon oxide film 306, which is the lower hard mask, is present at the bottom of a via-hole pattern 307a formed to the upper hard mask (silicon oxide film 308) and the intermediate hard mask (silicon nitride film 307). At the time of the above etching therefore, the SiOCH film 303 is not etched. In addition, the SiOCH film 303 is not etched owing to the protection of the silicon oxide film 306, even if oxygen radical ashing is used to remove the photoresist layer 310. In this case, the silicon oxide film 308 to be the top hard mask, has the edges hardly being rounded, and the photoresist can be removed through ashing.

Figure 8D:
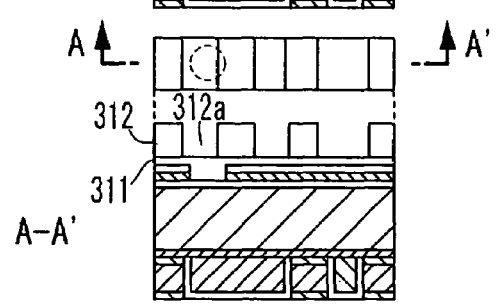
FIG. 8D is schematic view showing the second embodiment of the method of the manufacturing the semiconductor device of the present invention.

As shown in FIG. 8D, an antireflection film 311 and a second photoresist layer 312 are again formed to cover the silicon oxide film 308 and the silicon oxide film 306 of the via-hole pattern 307a. After that, an interconnection trench pattern 312a is formed to the second photoresist layer 312 by using the photolithography technique.

Figure 8E:
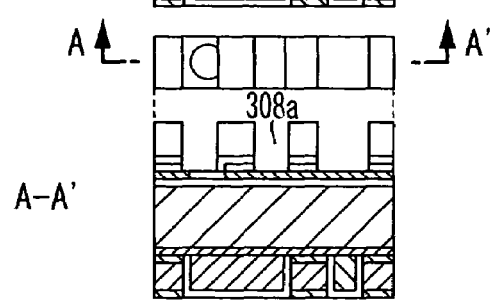
FIG. 8E is schematic view showing the second embodiment of the method of the manufacturing the semiconductor device of the present invention.
Figure 8F:
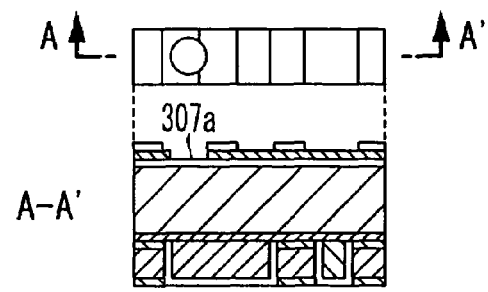
FIG. 8F is schematic view showing the second embodiment of the method of the manufacturing the semiconductor device of the present invention.

As shown in FIG. 8E, the antireflection film 311 and the silicon oxide film 308 are etched with the second photoresist layer 312 as a mask. As a result, a via-hole pattern 308a is formed. At this time, the silicon oxide film 306 is not etched, since the antireflection film 311 embeds the via-hole pattern 307a. As shown in FIG. 8F, the second photoresist layer 312 and the antireflection film 311 are removed with the oxygen plasma. At this time, the SiOCH film 303 is not etched owing to the presence of the three-layer hard mask thereon. In addition, the oxygen radical ashing is possible for the removal of the photoresist layer 312. In this case, the silicon oxide film 308 to be the top hard mask, has the edges hardly being rounded, and the photoresist can be removed through ashing.

Figure 8G:
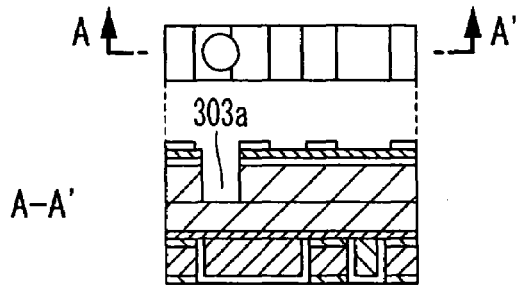
FIG. 8G is schematic view showing the second embodiment of the method of the manufacturing the semiconductor device of the present invention.

As shown in FIG. 8G, the silicon oxide film 306, which is the lower hard mask, is etched, with the silicon nitride film 307 having the via-hole pattern 307a as a mask. Subsequently, the SiOCH film 303 under the silicon oxide film 306 is etched with a plasma of a mixed gas of 40% or more of a nitrogen gas and 40% or more of a $CHF_3$ (fluorocarbon) gas with an appropriate amount of an oxygen gas. The etching is carried out for a predetermined time, and a half via hole 303a is formed. At this time, the silicon oxide film 308, which is the upper hard mask, is hardly etched, since a selection ratio between the SiOCH film 303 and the silicon oxide film 308 is 5 or more.

Figure 8H:
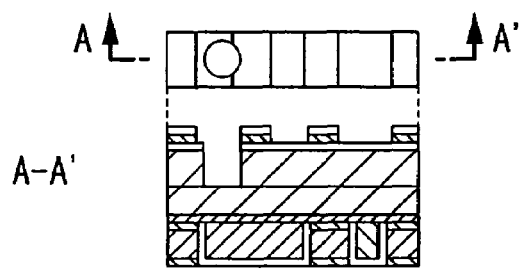
FIG. 8H is schematic view showing the second embodiment of the method of the manufacturing the semiconductor device of the present invention.
Figure 8I:
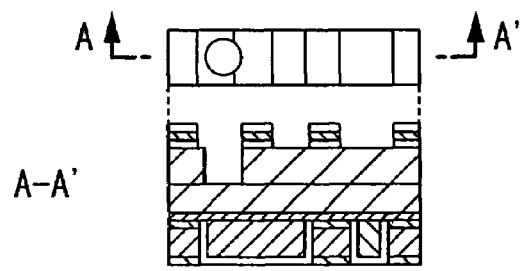
FIG. 8I is schematic view showing the second embodiment of the method of the manufacturing the semiconductor device of the present invention.

As shown in FIG. 8H, the silicon nitride film (SiN) 307, which is the intermediate hard mask, is etched, with the silicon oxide film 308, which is the upper hard mask, as a mask. As shown in FIG. 8I, the silicon oxide film ($SiO_2$) 306, which is the lower hard mask, is etched.

Figure 8J:
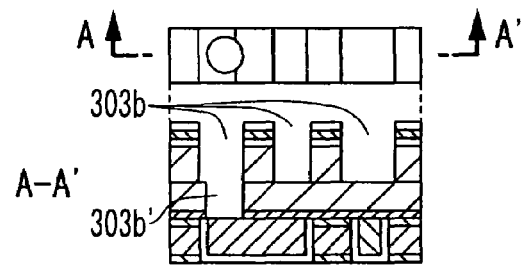
FIG. 8J is schematic view showing the second embodiment of the method of the manufacturing the semiconductor device of the present invention.

As shown in FIG. 8J, the SiOCH film 303 under the silicon oxide film 306 is etched further again with the plasma of the mixed gas containing 40% or more of the nitrogen gas and 40% or more of the $CHF_3$ gas with an appropriate amount of the oxygen gas, to form an interconnection trench pattern 303b. At the same time, the SiOCH film 303 under the half via hole 303a is etched simultaneously, and a half via hole 303b' is formed. As a result, a dual-damascene configuration is formed. At this time, a SiOCH sidewall is carbonitrided, and damage to the SiOCH film (303) in later process can be reduced. After that, by performing etch back to the cap film 302, which is the first inorganic film, a configuration can be obtained in which the interconnection trench (interconnection trench pattern 303b) is formed to the triple hard mask (306 to 308) and the SiOCH film 303, and the via hole (half via hole 303b') is formed to the remaining SiOCH film 303.

Figure 8K:
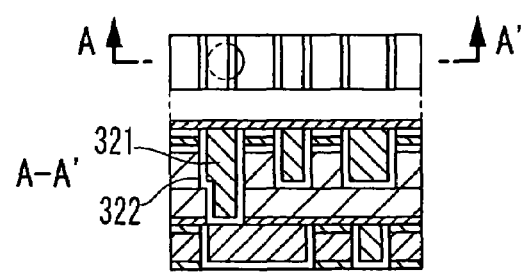
FIG. 8K is schematic view showing the second embodiment of the method of the manufacturing the semiconductor device of the present invention.

As shown in FIG. 8K, the copper interconnections are formed in the low dielectric constant interlayer film, by embedding a barrier film 322 and a copper film 321 at the same time to the interconnection trench (interconnection trench pattern 303b) and the via hole (hale via hole 303b'), and performing chemical-mechanical polishing. At this time, the silicon oxide film 308 is polished with the silicon nitride film 307 as a CMP stopper. The presence of this stopper secures interconnection depth without in-plane distribution and pattern dependence. Incidentally, the polishing may be stopped at the silicon oxide film 308, or may be performed up to the silicon oxide film 306. Further, the silicon oxide film 306 may be polished to disappear. FIG. 8K shows an example of stopping the polishing at the silicon oxide film 308.

Thus, by using the triple hard mask method of the present invention, the intermediate hard mask SiN functions as the CMP stopper, and the interconnection having the interconnection depth without in-plane distribution and pattern dependence can be formed. Since an inflow process of the photoresist and the antireflection film into the via as seen in the via first method is not included, the via poisoning and damage degradation of the low dielectric constant insulating film in repeated photolithography is not caused. Also, owing to the via first process, a margin for the via misalignment is large, and a high-reliability interconnection is provided.

In the above embodiment, the example of using the SiOCH film as a low dielectric constant film is shown. However, it is not limited to the SiOCH film, if a similar process is possible. Also, a combination is not limited to that of the silicon oxide film and the silicon nitride film, if the combination can make the selection ratio large, of the upper hard mask and the intermediate hard mask, and the intermediate hard mask and the lower hard mask. Further, the example of using the silicon carbonitride film for the stopper as the second inorganic film and for the cap film as the first inorganic film is shown. However, it is not specifically limited to the silicon carbonitride film, and material having interchangeable properties may be used as well.

Third Embodiment

AU/BD

FIGS. 9A to 9K are schematic views showing the third embodiment of the manufacturing method of the semiconductor device of the present invention. In each of Figures, the upper part is a top view, and the lower part is an AA cross-sectional view of the top view.

The third embodiment is different from the first embodiment in that the third embodiment uses different SiOCH films between via layers and between interconnection trench layers.

Figure 9A:
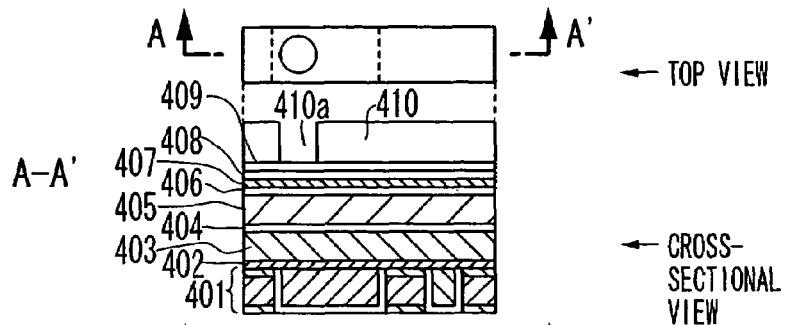
FIG. 9A is schematic view showing a third embodiment of the method of the manufacturing the semiconductor device of the present invention.

As shown in FIG. 9A, a silicon carbonitride film 402 is formed as a cap film that includes a first inorganic film, on a lower interconnection layer 401 of a semiconductor substrate having a lower interconnection. A first SiOCH film 403, which is a low dielectric constant insulating film, is formed thereon as a first interlayer film, corresponding to a depth of a via hole, with the plasma CVD method. The first SiOCH film 403 is a film formed with organosiloxane monomer as a main raw material, and may be formed by gas in which an oxidizing agent and so on, such as oxygen, is included. The SiOCH film 403 is a film that does not include a pore (hole) of 0.3 nm or more. The SiOCH film 403 is exemplified by the Black Diamond of Applied Materials, Inc., and the Aurora 2.7 of ASM International N.V.

On the first SiOCH film 403, a silicon oxide film 404, which is a second inorganic film, is formed as an etching stopper for a trench portion. On the silicon oxide film 404, which is the second inorganic film, a second SiOCH film 405, which is a low dielectric constant insulating film, is formed corresponding to a depth of an upper interconnection, with the plasma CVD method. Similar to the first SiOCH film 403, the second SiOCH film 405 is a film formed with organosiloxane monomer as a main raw material, and may be formed by gas in which an oxidizing agent and so on, such as oxygen, is included. The SiOCH film 405 is a film that includes a pore (hole) of 0.3 nm or more. The SiOCH film 405 is exemplified by the Black Diamond 2 of Applied Materials, Inc., the Aurora 2.4 of ASM International N.V., and the orion 2.2 of Tricon Technology, Inc.

A silicon oxide film 406, which is a third inorganic film, is formed as a bottom film (lower hard mask) of a triple hard mask, on the second SiOCH film 405. Further, on the silicon oxide film 406, a silicon nitride film 407 as a third inorganic film, is formed as an intermediate film (intermediate hard mask) of the triple hard mask. In addition, on the silicon nitride film 407, a silicon oxide film 408 is formed as a top film (upper hard mask) of the triple hard mask. An antireflection film layer 409 and a first photoresist layer 410 are formed on the silicon oxide film 408, and a via-hole pattern 410a is formed to the first photoresist layer 410 by using the photolithography technique.

Figure 9B:
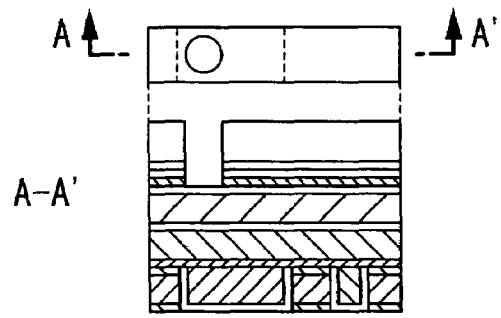
FIG. 9B is schematic view showing the third embodiment of the method of the manufacturing the semiconductor device of the present invention.
Figure 9C:
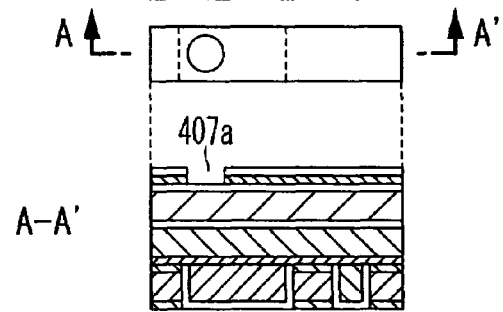
FIG. 9C is schematic view showing the third embodiment of the method of the manufacturing the semiconductor device of the present invention.

As shown in FIG. 9B, the antireflection film 409, the silicon oxide film 408, and the silicon nitride film 407, are etched in order by using fluorine-series plasma, with the photoresist layer 410 as a mask. As shown in FIG. 9C, the first photoresist layer 410 and the antireflection film 409 are removed with an oxygen plasma. At this time, the silicon oxide film 406, which is the lower hard mask, is present at the bottom of a via-hole pattern 407a formed to the upper hard mask (silicon oxide film 408) and the intermediate hard mask (silicon nitride film 407). Therefore, the second SiOCH film 405 is not etched at the time of the above etching. In addition, the second SiOCH film 405 is not etched by being protected by the silicon oxide film 406, even if oxygen radical ashing is used to remove the photoresist layer 410. In this case, the silicon oxide film 408 to be the top hard mask, has the edges hardly being rounded, and the photoresist can be removed through ashing.

Figure 9D:
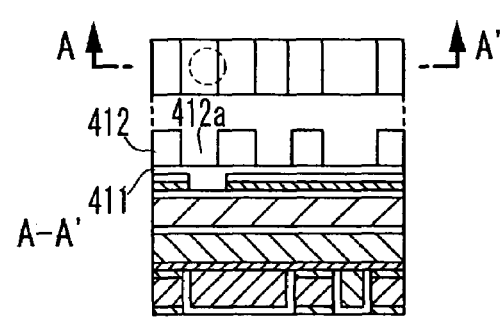
FIG. 9D is schematic view showing the third embodiment of the method of the manufacturing the semiconductor device of the present invention.

As shown in FIG. 9D, an antireflection film 411 and a second photoresist layer 412 are again formed to cover the silicon oxide film 408 and the silicon oxide film 406 of the via-hole pattern 407a. After that, an interconnection trench pattern 412a is formed to the second photoresist layer 412 by using the photolithography technique.

Figure 9E:
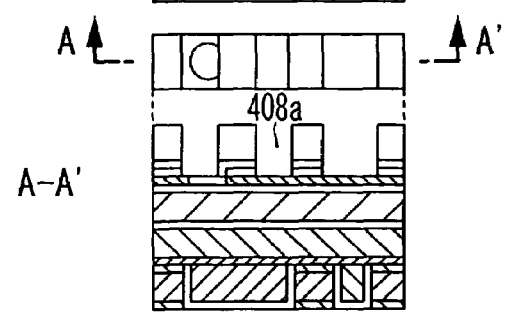
FIG. 9E is schematic view showing the third embodiment of the method of the manufacturing the semiconductor device of the present invention.
Figure 9F:
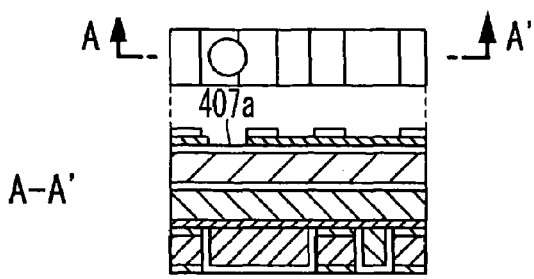
FIG. 9F is schematic view showing the third embodiment of the method of the manufacturing the semiconductor device of the present invention.

As shown in FIG. 9E, the antireflection film 411 and the silicon oxide film 408 are etched, with the second photoresist layer 412 as a mask. As a result, a via-hole pattern 408a is formed. At this time, the silicon oxide film 406 is not etched since the antireflection film 411 embeds the via-hole pattern 408a. As shown in FIG. 9F, the second photoresist layer 412 and the antireflection film 411 are removed with the oxygen plasma. At this time, the second SiOCH film 405 is not etched owing to the three-layer hard mask thereon. In addition, the oxygen radial ashing is possible for the removal of the photoresist layer 412. In this case, the silicon oxide film 408 to be the top hard mask, has the edges hardly being rounded, and the photoresist can be removed through ashing.

Figure 9G:
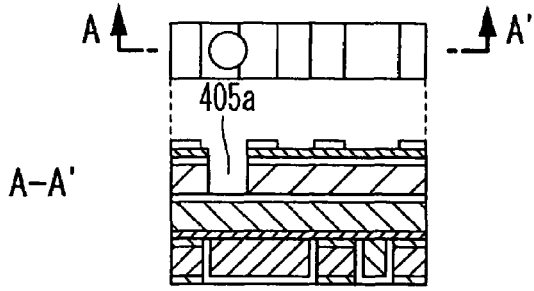
FIG. 9G is schematic view showing the third embodiment of the method of the manufacturing the semiconductor device of the present invention.

As shown in FIG. 9G, the silicon oxide film 406, which is the lower hard mask, is etched with the silicon nitride film 407 having the via-hole pattern 407a as a mask. Subsequently, the second SiOCH film 405 under the silicon oxide film 406 is etched with a plasma of a mixed gas containing 40% or more of a nitrogen gas and 40% or more of a $CHF_3$ gas with an appropriate amount of an oxygen gas. The etching is stopped at the silicon oxide film 404 as the etching stopper, and a half via hole 405a is formed. At this time, the silicon oxide film 408, which is the upper hard mask, is hardly etched, since a selection ratio between the SiOCH film 405 and the silicon oxide film 408 is 5 or more.

Figure 9H:
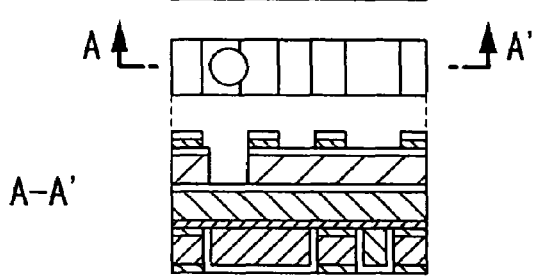
FIG. 9H is schematic view showing the third embodiment of the method of the manufacturing the semiconductor device of the present invention.
Figure 9I:
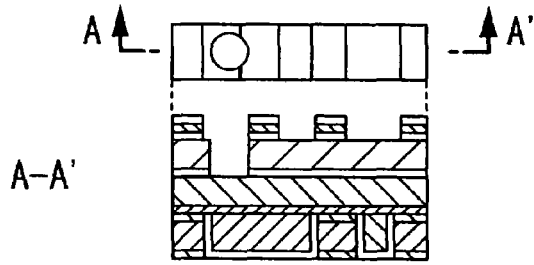
FIG. 9I is schematic view showing the third embodiment of the method of the manufacturing the semiconductor device of the present invention.

As shown in FIG. 9H, the silicon nitride film (SiN) 407, which is the intermediate hard mask, is etched, with the silicon oxide film 408, which is the upper hard mask, as a mask. As shown in FIG. 9I, the silicon oxide film ($SiO_2$) 406, which is the lower hard mask, is etched. At this time, the silicon oxide film 404 as the etching stopper at the bottom of the half via hole 405a, is etched at the same time.

Figure 9J:
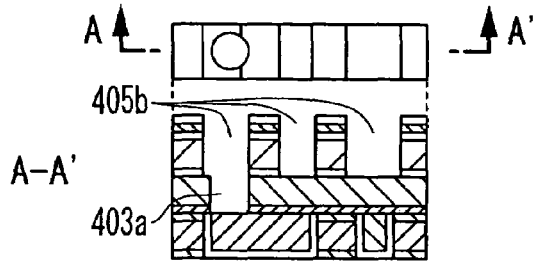
FIG. 9J is schematic view showing the third embodiment of the method of the manufacturing the semiconductor device of the present invention.

As shown in FIG. 9J, the second SiOCH film 405 under the silicon oxide film 406 is etched further again with the plasma of the mixed gas containing 40% or more of the nitrogen gas and 40% or more of the $CHF_3$ gas with an appropriate amount of the oxygen gas, to form an interconnection trench pattern 405b. At the same time, the first SiOCH 403 under the half via hole 405a is etched simultaneously, and a half via hole 403a is formed. As a result, a dual-damascene configuration is formed. At this time, a SiOCH sidewall is carbonitrided, and damage to the SiOCH films (403 and 405) in later processes can be reduced. After that, by performing etch back to the cap film 402, which is the first inorganic film, a configuration is obtained in which the interconnection trench (interconnection trench pattern 405b) is formed to the triple hard mask (406 to 408) and the second SiOCH film 405, and a via hole is formed to the first SiOCH film 403.

Figure 9K:
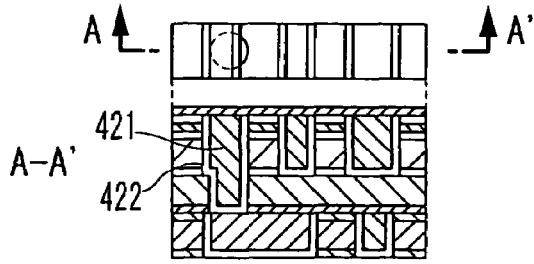
FIG. 9K is schematic view showing the third embodiment of the method of the manufacturing the semiconductor device of the present invention.

As shown in FIG. 9K, the copper interconnections is formed in the low dielectric constant interlayer film, by embedding a barrier film 422 and a copper film 421 at the same time to the interconnection trench (interconnection trench pattern 405b) and the via hole (half via hole pattern 403a), and performing the chemical-mechanical polishing. At this time, the silicon oxide film 408 is polished with the silicon nitride film 407 as a CMP stopper. The presence of this stopper secures the interconnection depth without in-plane distribution and pattern dependence. Incidentally, the polishing may be stopped at the silicon oxide film 408, or may be performed up to the silicon oxide film 406. Further, the silicon oxide film 406 may be polished to disappear. FIG. 9K shows an example of stopping the polishing at the silicon oxide film 408.

Figure 10A:
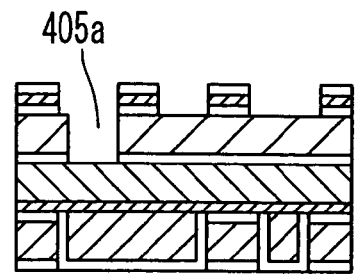
FIG. 10A is a schematic cross-sectional view showing a variation example of the third embodiment of the method of manufacturing the semiconductor device of the present invention.
Figure 10B:
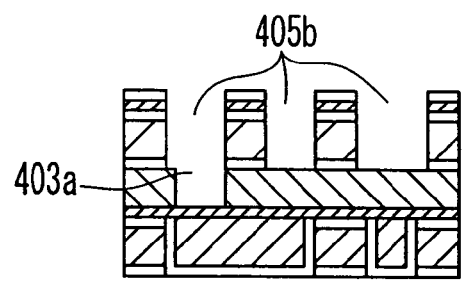
FIG. 10B is a schematic cross-sectional view showing a variation example of the third embodiment of the method of manufacturing the semiconductor device of the present invention.
Figure 10C:
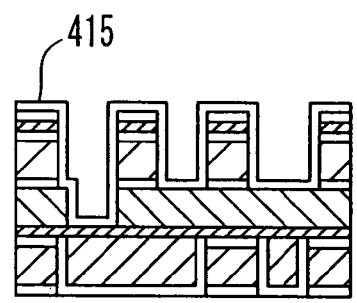
FIG. 10C is a schematic cross-sectional view showing a variation example of the third embodiment of the method of manufacturing the semiconductor device of the present invention.
Figure 10D:
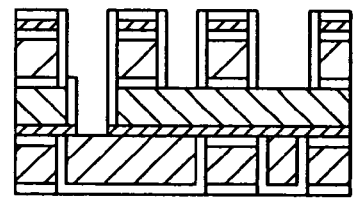
FIG. 10D is a schematic cross-sectional view showing a variation example of the third embodiment of the method of manufacturing the semiconductor device of the present invention.
Figure 10E:
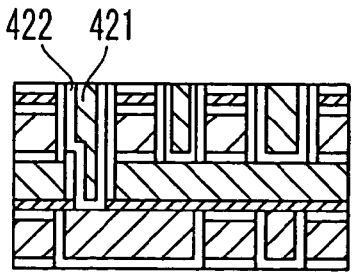
FIG. 10E is a schematic cross-sectional view showing a variation example of the third embodiment of the method of manufacturing the semiconductor device of the present invention.

When a SiOCH film having pores is used as in the case of the embodiment, there is concern over inflow and diffusion of a cleaning fluid, a barrier film and so on, from a sidewall etching section. Therefore, a pore seal technique may be used. FIGS. 10A to 10E are schematic cross-sectional views showing a variation example of the third embodiment of the method of manufacturing the semiconductor device of the present invention. FIGS. 10A and 10B correspond to FIGS. 9I and 9J respectively. FIGS. 10C and 10E correspond to after FIG. 9J and FIG. 9K.

After forming a dual-damascene configuration with the triple hard mask as shown in FIGS. 10A and 10B (FIGS. 9I and 9J), a sealant 415 is formed to cover sidewall sections of films that includes pores, as shown in FIG. 10C. The sealant 415 needs to be formed conformally as a thin film, preferably being a film formed with the plasma CVD. Also, a film that does not include a pore of 0.3 nm or more is preferable, since pore sealing is performed. Such a sealant is exemplified by SiOCH that does not include organic porous silica and a pore. As shown in FIG. 10D, etch back is carried out after forming the sealant 415, and the cap film 402 is removed after removing sealant other than sidewalls. As shown in FIG. 10E, a dual-damascene interconnection is formed through the CMP polishing, after forming the barrier film 422 and the copper film 421.

Additionally, the processes of FIGS. 10C to 10E can be used for other embodiments in the description.

Thus, the triple hard mask of the present invention is effective for dual-damascene formation of SiOCH of different kinds, and can reduce an effective relative dielectric constant. At this time, the formation can be realized without any change to the method, operation, and effect of the triple hard mask.

Fourth Embodiment

Four-Layer Hard Mask

FIGS. 11A to 11K are schematic cross-sectional views showing the fourth embodiment of the manufacturing method of the semiconductor device of the present invention. Here, top views as shown in FIGS. 5, 8, and 9 are omitted.

The fourth embodiment is different from the first embodiment in that the fourth embodiment uses a four-layer hard mask as a hard mask.

Figure 11A:
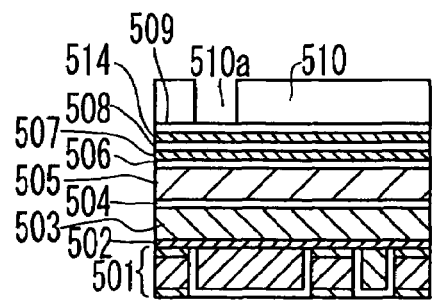
FIG. 11A is a schematic cross-sectional view showing a fourth embodiment of the manufacturing method of the semiconductor device according to the present invention.

As shown in FIG. 11A, a silicon carbonitride film 502 is formed as a cap film that includes a first inorganic film, on a lower interconnection layer 501 of a semiconductor substrate having a lower interconnection. A SiOCH film 503, which is a low dielectric constant insulating film, is formed as a first interlayer film thereon corresponding to a depth of a via hole, with the plasma CVD method. On the SiOCH film 503, a silicon oxide film 504, which is a second inorganic film, is formed as an etching stopper for a trench portion. On the silicon oxide film 504, which is the second inorganic film, a SiOCH 505, which is a low dielectric constant insulating film, is formed corresponding to a depth of an upper interconnection, with the plasma CVD method. Further, a silicon oxide film 506 as a third inorganic film, a silicon nitride film 507 as a fourth inorganic film, a silicon oxide film 508 as a fifth inorganic film, and a silicon nitride film 514 as a sixth inorganic film, are formed in order, on the SiOCH film 505. These four inorganic films function as a four-layer hard mask. Further, an antireflection film layer 509 and a first photoresist layer 510 are formed on the silicon nitride film 514. Then, a via-hole pattern 510a is formed to the first photoresist layer 510 by using the photolithography technique.

Figure 11B:
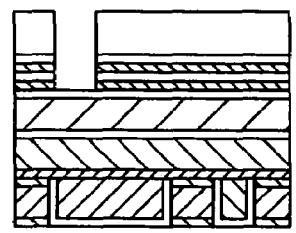
FIG. 11B is a schematic cross-sectional view showing the fourth embodiment of the manufacturing method of the semiconductor device according to the present invention.
Figure 11C:
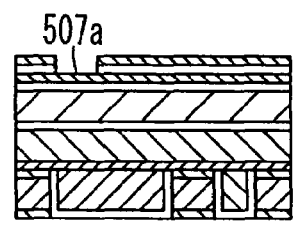
FIG. 11C is a schematic cross-sectional view showing the fourth embodiment of the manufacturing method of the semiconductor device according to the present invention.

As shown in FIG. 11B, the antireflection film 509, the silicon nitride film 514, the silicon oxide film 508, and the silicon nitride film 507 are etched in order by using fluorine-series plasma, with the photoresist layer 510 as a mask. As shown in FIG. 11C, the first photoresist layer 510 and the antireflection film 509 are removed with an oxygen plasma. At this time, the silicon oxide film 506, which is the lower hard mask, is present at the bottom of a via-hole pattern 507a formed to the hard mask of the upper three layers (514, 508, and 507). Therefore, the SiOCH film 505 is not etched at the time of the above etching. In addition, the SiOCH film 505 is not etched by being protected by the silicon oxide film 506, even if oxygen radial ashing is used for the removal of the photoresist layer 510. In this case, the silicon nitride film 514 to be the top hard mask, has the edges barely being rounded, and the photoresist can be removed through ashing.

Figure 11D:
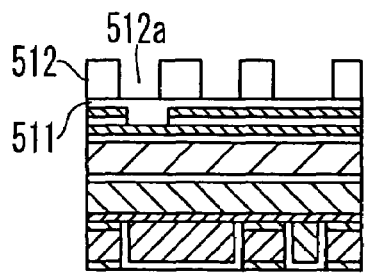
FIG. 11D is a schematic cross-sectional view showing the fourth embodiment of the manufacturing method of the semiconductor device according to the present invention.

As shown in FIG. 11D, an antireflection film 511 and a second photoresist layer 512 are again formed to cover the silicon nitride film 514 and the via-hole pattern 507a. After that, an interconnection trench pattern 512a is formed to the second photoresist layer 512 by using the photolithography technique.

Figure 11E:
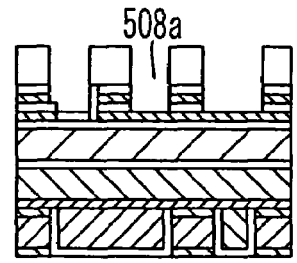
FIG. 11E is a schematic cross-sectional view showing the fourth embodiment of the manufacturing method of the semiconductor device according to the present invention.
Figure 11F:
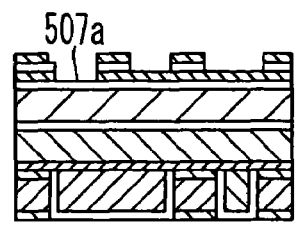
FIG. 11F is a schematic cross-sectional view showing the fourth embodiment of the manufacturing method of the semiconductor device according to the present invention.

As shown in FIG. 11E, the antireflection film 511, the silicon nitride film 514, and the silicon oxide film 508 are etched with the second photoresist layer 512 as a mask. As a result, a via-hole pattern 508a is formed. At this time, the silicon oxide film 506 is not etched since the antireflection film 511 embeds the via-hole pattern 507a. As shown in FIG. 11F, the second photoresist layer 512 and the antireflection film 511 are removed with an oxygen plasma. At this time, the SiOCH film 505 is not etched owing to the four-layer hard mask thereon. In addition, oxygen radical ashing is possible for the removal of the photoresist layer 512. In this case, the silicon nitride film 514 to be the top hard mask, has the edges barely being rounded, and the photoresist can be removed through ashing.

As shown in FIG. 11F, the four-layer hard mask process is approximately the same as FIG. 5F, and a basic idea thereof is the same as that of the triple hard mask. However, owing to the silicon nitride film (SiN) 514 in the top layer, the four-layer hard mask process is suitable for etching the oxide film hard mask in the lower layer, and has an advantage of each hard mask being made thinner.

Figure 11G:
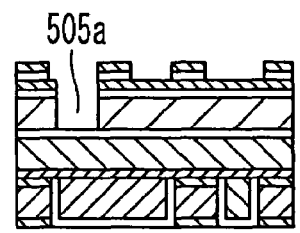
FIG. 11G is a schematic cross-sectional view showing the fourth embodiment of the manufacturing method of the semiconductor device according to the present invention.

As shown in FIG. 11G, the silicon oxide film 508 and the silicon oxide film 506, which is the lower hard mask, are etched with the silicon nitride film 507 having the via-hole pattern 507a as a mask. At this time, high selection etching is possible, since the upper hard mask is the silicon nitride film 514. Subsequently, the SiOCH film 505 under the silicon oxide film 506 is etched with a plasma of a mixed gas containing 40% or more of a nitrogen gas and 40% or more of a CHF$_3$ gas with an appropriate amount of an oxygen gas. The etching is stopped at the silicon oxide film 504 functioning as an etching stopper, and a half via hole 505a is formed.

Figure 11H:
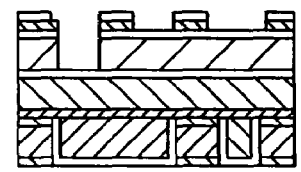
FIG. 11H is a schematic cross-sectional view showing the fourth embodiment of the manufacturing method of the semiconductor device according to the present invention.
Figure 11I:
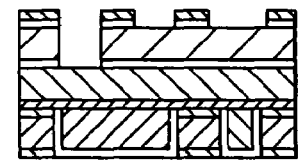
FIG. 11I is a schematic cross-sectional view showing the fourth embodiment of the manufacturing method of the semiconductor device according to the present invention.

As shown in FIG. 11H, the silicon nitride film 507, which is the intermediate hard mask, is etched with the silicon nitride film 512 and the silicon oxide film 508, which are the upper hard masks, as a mask. At this time, the silicon nitride film 514 is etched back to disappear. As shown in FIG. 11I, the silicon oxide film 506, which is the lower hard mask, is etched. At this time, the silicon oxide film 504 as an etching stopper at the bottom of the half via hole 505a, and the silicon oxide film 508 as the hard mask in the upper layer, are etched at the same time.

Figure 11J:
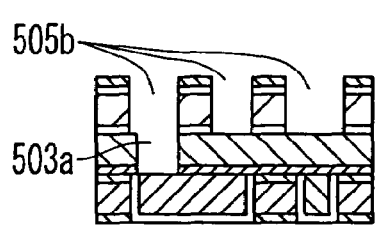
FIG. 11J is a schematic cross-sectional view showing the fourth embodiment of the manufacturing method of the semiconductor device according to the present invention.

As shown in FIG. 11J, the SiOCH film 505 under the silicon oxide film 506 is etched further again with the plasma of the mixed gas containing 40% or more of the nitrogen gas and 40% or more of the CHF$_3$ gas with an appropriate amount of the oxygen gas, to form an interconnection trench pattern 505b. At the same time, the SiOCH film 503 under the half via hole 505a is etched simultaneously, and a half via hole 503a is formed. As a result, a dual-damascene configuration is formed. At this time, a SiOCH sidewall is carbonitrided, and damage to the SiOCH films (505 and 503) in later processes can be reduced. After that, by performing the etch back to the cap film 502, which is the first inorganic film, a configuration can be obtained in which the interconnection trench (interconnection trench pattern 505b) is formed to the hard masks (506 and 507) and the SiOCH film 505, and the via hole (half via hole 503a) is formed to the SiOCH film 503.

Figure 11K:
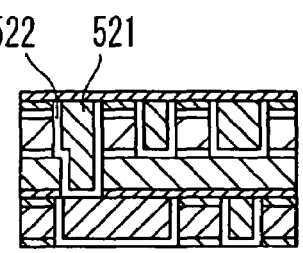
FIG. 11K is a schematic cross-sectional view showing the fourth embodiment of the manufacturing method of the semiconductor device according to the present invention.

As shown in FIG. 11K, the copper interconnections are formed in the low dielectric constant interlayer film, by embedding a barrier film 522 and a copper film 521 at the same time to the interconnection trench (interconnection trench pattern 505b) and the via hole (half via hole 503a), and performing the chemical-mechanical polishing.

Thus, by using the four-layer hard mask method of the present invention, a hard mask can be thinner with the same technique as that of the triple hard mask. Additionally, etching of the SiOCH film having a high selection ratio with the silicon oxide film of the hard mask is possible; therefore, the etching technique is also applicable to the SiOCH etching in the dual hard mask method.

In the above embodiment, the example of using the SiOCH film as the low dielectric constant interlayer film is shown. However, it is not limited to the SiOCH film, if the same process is possible. Also, a combination of the four-layer hard mask is not limited to that of the silicon oxide film and the silicon nitride film, if the selection ratio of the combination can be made larger. Further, the example of using the silicon carbonitride film for the stopper as the second inorganic film and for the cap film as the first inorganic film is shown. However, it is not specifically limited to the silicon carbonitride film, and material having interchangeable properties may be used as well.

Fifth Embodiment

Multilayer Configuration

Figure 12:
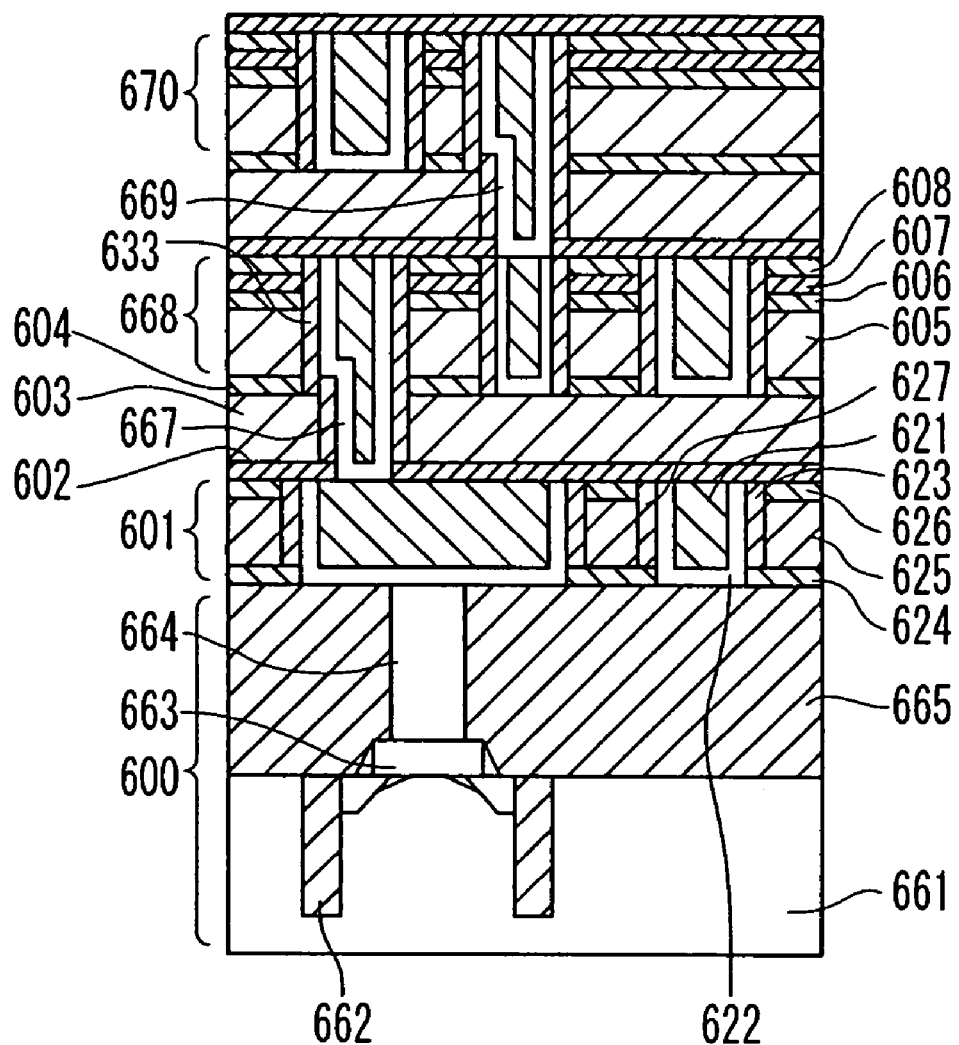
FIG. 12 is a schematic cross-sectional view showing a fifth embodiment of the manufacturing method of the semiconductor device according to the present invention.

FIG. 12 is a schematic cross-sectional view showing the fifth embodiment of the manufacturing method of the semiconductor device of the present invention. The fifth embodiment shows an example of further applying the first to fourth embodiments, to a multilayer configuration. Here, an embodiment is shown in which copper multilayer interconnections are formed to a low dielectric constant insulating film containing carbon, on a MOSFET 663 separated by an element separation oxide film 662 on a silicon substrate 661. Structural characteristics are shown below.

In the embodiment as well, an interconnection with small interconnection resistance variations and a high misalignment margin can be formed, by using a triple hard mask to form a dual-damascene configuration, and carrying out etching with a mixed gas plasma of 40% or more of nitrogen and 40% or more of a fluorocarbon gas with an additional oxygen gas. Here, the example of using a SiOCH film as first and second interlayer films, which are low dielectric constant insulating films, are shown; a porous organic silica film for example, that mainly includes methyl silica is also applicable, and an amorphous SiOCH film through He plasma decomposition of methoxymethyl silica can also be used. These are also applicable to the first to fourth embodiments mentioned above.

On the MOSFET 663, a silicon oxide film 665 having a W contact plug 664 is formed. On the silicon oxide film 665, a first-layer copper interconnection layer 601 is formed as a lower interconnection layer. A silicon carbonitride film 624 with 50 nm thickness is formed as an etch stop film of the interconnection trench, in the first-layer copper interconnection layer 601. On the silicon carbonitride film, a porous SiOCH film 625 of 200 nm thickness, and a silicon oxide film 626 of 50 nm thickness as a hard mask thereof, are formed. The first copper interconnection layer 601 has a copper interconnection. The copper interconnection is provided to an interconnection trench penetrating a multilayered insulating film that includes a silicon oxide film 624, a SiOCH film 625, and a silicon carbonitride film 626. The copper interconnection has a barrier film 622 of Ta (10 nm)/TaN (10 nm) covering the bottom and side surface of the interconnection trench, and a copper film 621 that is surrounded by the barrier film 622. The sidewall of the SiOCH film 625 that is in contact with the barrier film 622 is covered with an organic silica seal film 623 for protecting the SiOCH film 625 from damage caused by organic removal and barrier sputtering. The copper interconnection of the first copper interconnection layer 601 is connected to the W contact plug 664.

A silicon carbonitride film 602 of 50 nm thickness is formed as a via etching stopper layer, on the copper interconnection of the first copper interconnection layer 601. Further, a SiOCH film 603 of 200 nm thickness, and a silicon oxide film 604 of 50 nm thickness as an interconnection trench etching stopper layer, are formed. The SiOCH film 603 may be planarized through the CMP and so on. Further, a SiOCH film 605 of 200 nm thickness, and a silicon oxide film 606 of 50 nm thickness, a silicon nitride film 607 of 50 nm thickness, and a silicon oxide film 608 of 50 nm thickness as the hard masks, are formed on the silicon oxide film 604.

A second copper interconnection layer 668 has a copper interconnection. The copper interconnection is provided to an interconnection trench that penetrates the silicon oxide film 608/the silicon nitride film 607/the silicon oxide film 606/the SiOCH film 605/the silicon oxide film 604, among the multilayered-structure insulating film. As described above, the copper interconnection has the barrier film covering the bottom and side surface of the interconnection trench, and the copper film surrounded by the barrier film. A Cu via plug 667 that penetrates the SiOCH film 603 and the silicon carbonitride film 602 is formed from the bottom of the second copper interconnection 668. The first Cu via plug 667 is connected to the copper interconnection of the first copper interconnection layer 601. A seal layer 633 of organic silica is formed to the sidewall of the SiOCH film that is in contact with the barrier film, forming the layer for protecting the SiOCH film from the damage caused by the organic removal and the barrier sputtering.

The same configuration as that of the second copper interconnection layer 668 and the Cu via plug 667 can be formed for a copper interconnection of a third copper interconnection layer 670, and a Cu via plug 669 that connects the third copper interconnection layer 670 and the second copper interconnection layer 668. By laminating the configurations, the multilayer interconnection can be formed.

The present invention makes it possible to increase a misalignment margin, and to reduce a short circuit and variations in interconnection resistance caused by via misalignment. It is possible to avoid via poisoning, and to form interconnection thickness with in-plane uniformity and without pattern dependence. Consequently, a multilayer interconnection with high reliability can be obtained.

What is claimed is:

1. A semiconductor device comprising:
   a first interconnection layer which is formed on an upper side of a substrate, and includes a first interconnection metal; and
   an interlayer insulating layer which is formed on said first interconnection layer, and includes a second interconnection metal formed within said interlayer insulating layer and a via formed within said interlayer insulating layer, said via connected with said first interconnection metal at one end thereof and connected with said second interconnection metal at the other end thereof;
   wherein said interlayer insulating film has a relative dielectric constant lower than that of a silicon oxide film;
   at least one of a portion corresponding to a sidewall of said via and a portion corresponding to a sidewall of said second interconnection in said interlayer insulating layer is in at least one of a nitrided state and a carbonized state; and
   an upper portion of said interlayer insulating layer includes a silicon oxide film, a silicon nitride film and a silicon oxide film in order from a lower portion of said interlayer insulating layer.

2. The semiconductor device according to claim 1, wherein said interlayer insulating layer is a film including silicon, carbon, oxygen and hydrogen.

3. The semiconductor device according to claim 2, wherein an insulating film having a certain compactness is formed in at least one of an area between said interlayer insulating layer and said via and an area between said interlayer insulating layer and said second interconnection.

4. The semiconductor device according to claim 2, wherein said interlayer insulating layer includes:
   a first interlayer insulating layer which includes said via, and
   a second interlayer insulating layer which includes said second interconnection,
   wherein a material of said first interlayer insulating layer is different from that of said second interlayer insulating layer.

5. The semiconductor device according to claim 4, further comprising:
   an etching stopper layer which is formed between said first interlayer insulating film and said second interlayer insulating film.

* * * * *